(12) United States Patent  
Nagai et al.

(10) Patent No.: US 7,829,476 B2
(45) Date of Patent: Nov. 9, 2010

(54) METHOD OF MANUFACTURING SEMICONDUCTOR DEVICE AND SEMICONDUCTOR DEVICE

(75) Inventors: Kouichi Nagai, Kawasaki (JP); Kaoru Saigoh, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/403,371

(22) Filed: Mar. 12, 2009

(65) Prior Publication Data

US 2009/0243038 A1 Oct. 1, 2009

(30) Foreign Application Priority Data

Mar. 25, 2008 (JP) ............................. 2008-078122

(51) Int. Cl.
*H01L 21/00* (2006.01)
*H01L 21/8242* (2006.01)
*H01L 21/20* (2006.01)

(52) U.S. Cl. ........................... 438/957; 438/3; 438/240; 438/393

(58) Field of Classification Search ................ 438/957, 438/3, 240, 656, 238, 239, 386, 399, 393, 438/250

See application file for complete search history.

(56) References Cited

U.S. PATENT DOCUMENTS

| 6,432,771 | B1 * | 8/2002 | Ciavatti ...................... 438/253 |
| 6,479,899 | B1 * | 11/2002 | Fukuda et al. .............. 257/758 |
| 7,425,740 | B2 * | 9/2008 | Liu et al. ..................... 257/306 |
| 7,692,227 | B2 * | 4/2010 | Yamabi et al. .............. 257/292 |
| 2005/0062170 | A1 | 3/2005 | Biggs et al. | |

FOREIGN PATENT DOCUMENTS

| JP | 2003-86624 A | 3/2003 |
| JP | 2004-296643 A | 10/2004 |
| JP | 2005-94013 A | 4/2005 |

* cited by examiner

*Primary Examiner*—Chuong Anh Luu
(74) *Attorney, Agent, or Firm*—Fujitsu Patent Center

(57) ABSTRACT

A method of manufacturing a semiconductor device has forming a capacitor having electrodes and a ferroelectric film provided therebetween above a substrate, forming a pad electrode electrically connected to one of the electrodes of the capacitor above the substrate, forming a protective film covering the pad electrode over the substrate, forming an opening in the protective film exposing at least a part of the pad electrode, bringing a measurement terminal into contact with the exposed surface of the pad electrode, etching the surface of the pad electrode after the measurement terminal is brought into contact therewith, and forming a hydrogen absorbing film on the protective film and the pad electrode exposed through the opening.

6 Claims, 22 Drawing Sheets

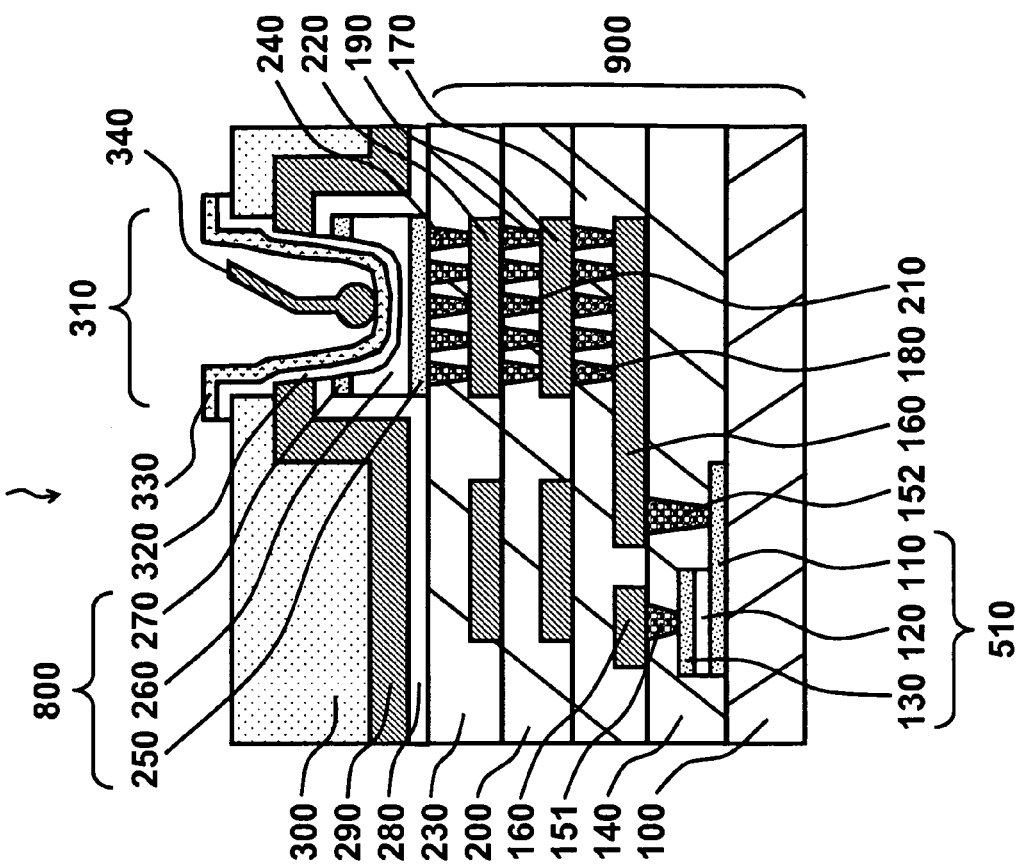
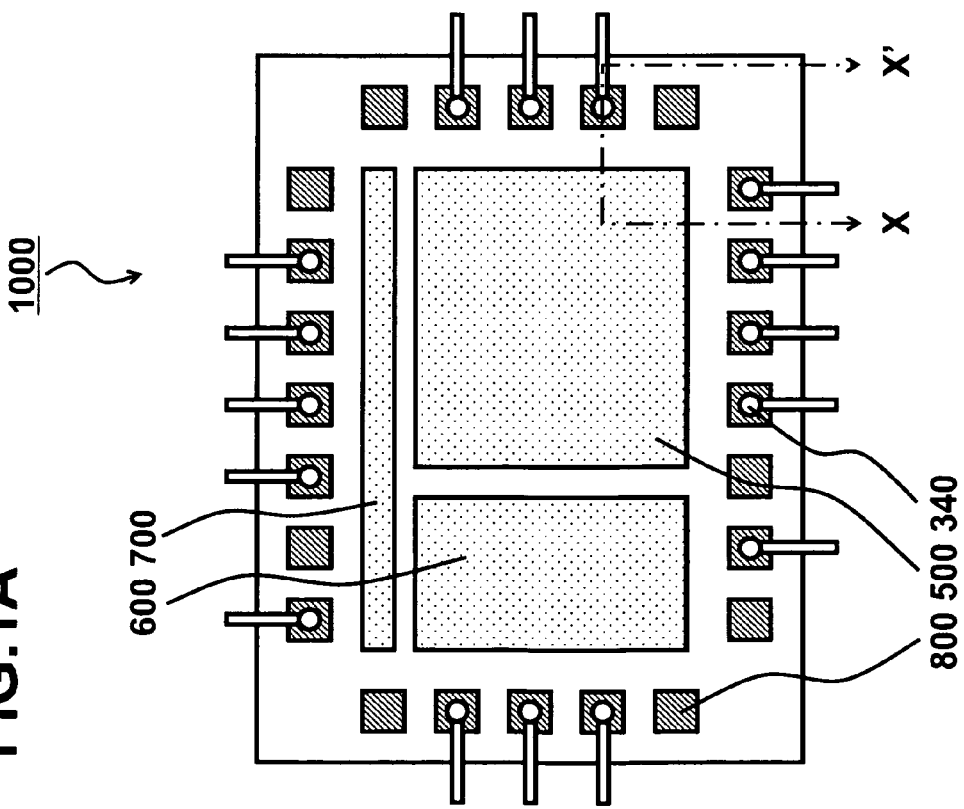

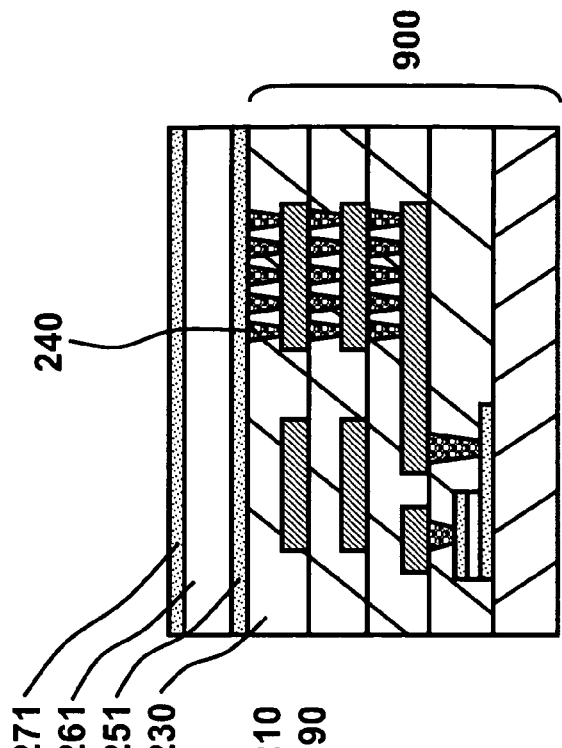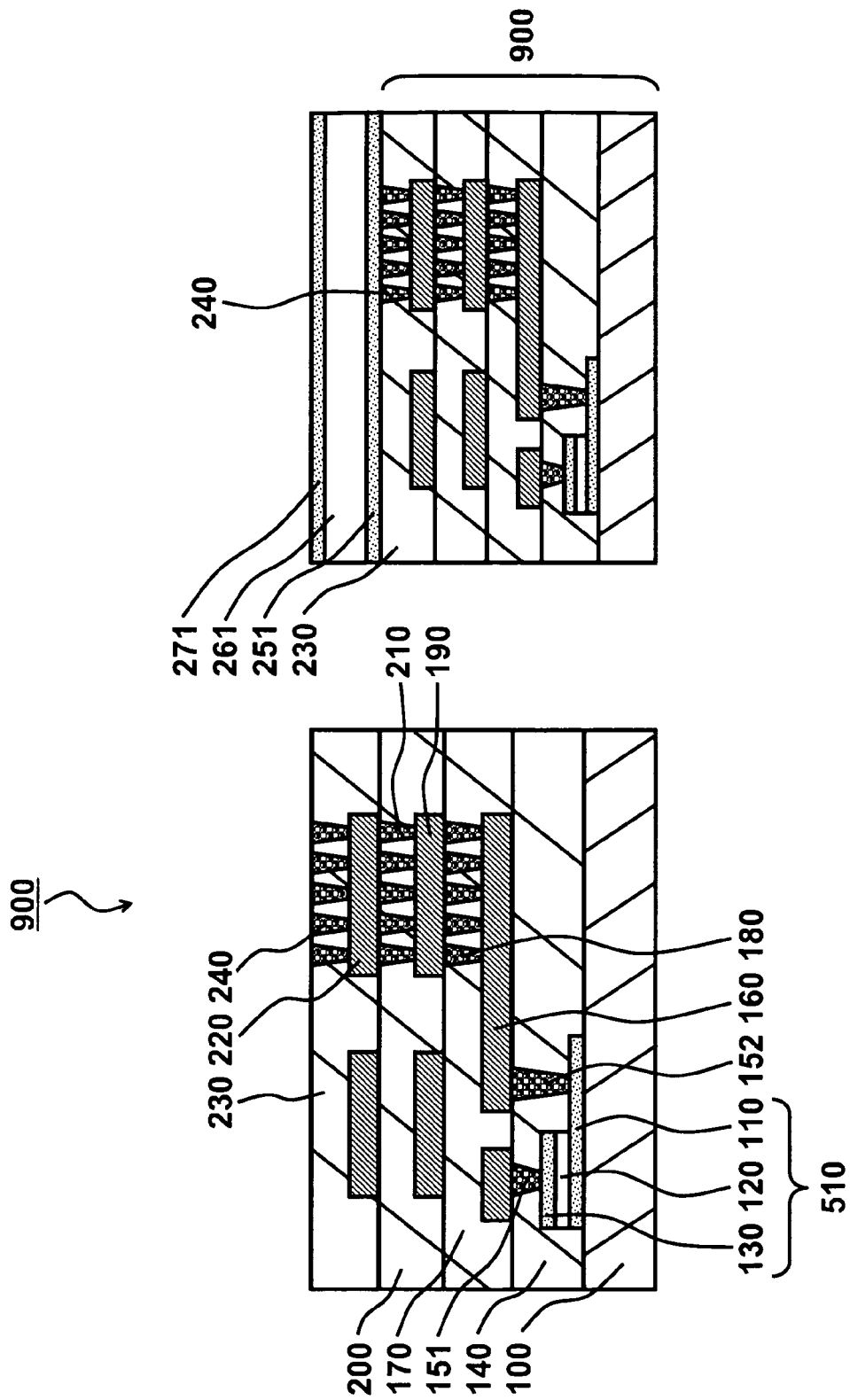
FIG. 2A
FIG. 2B

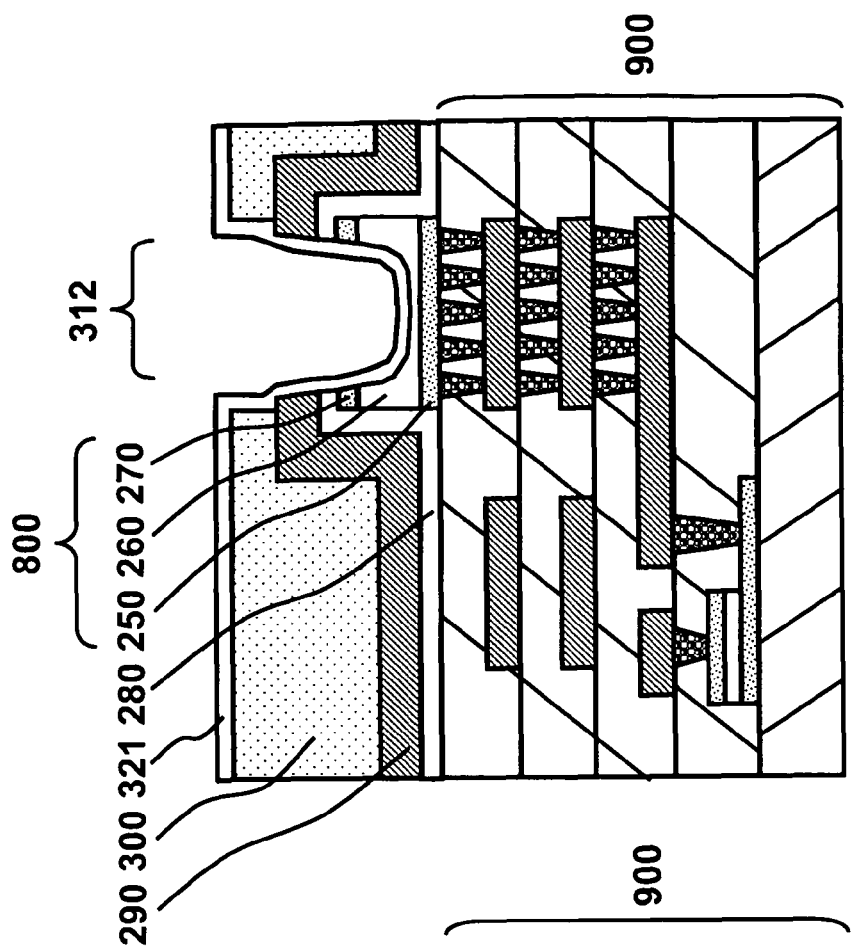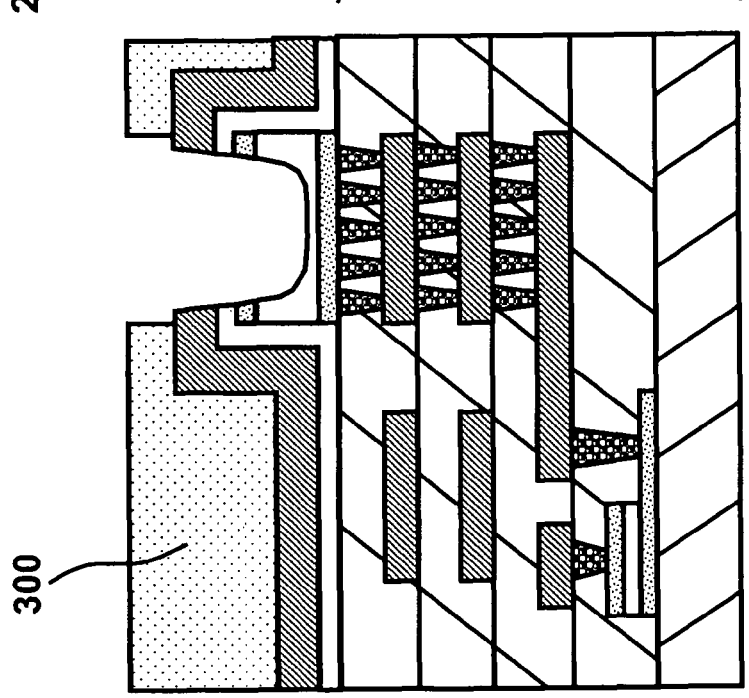

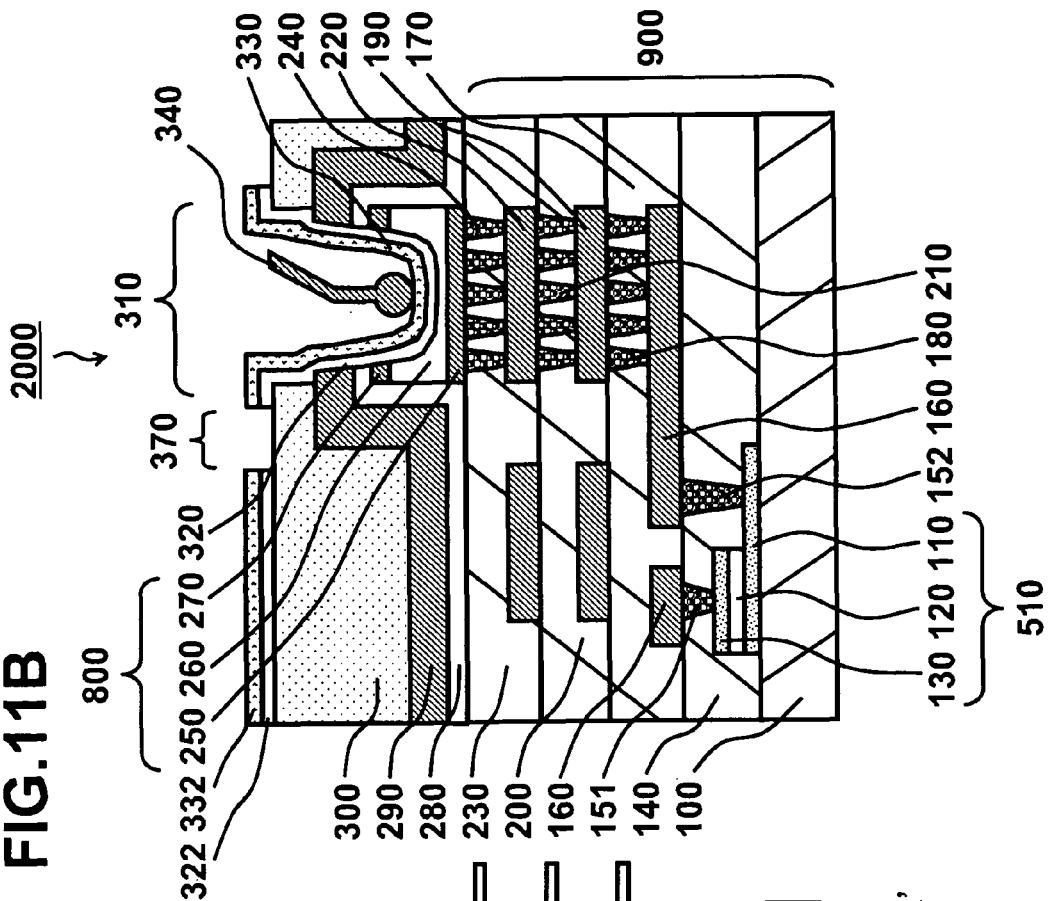
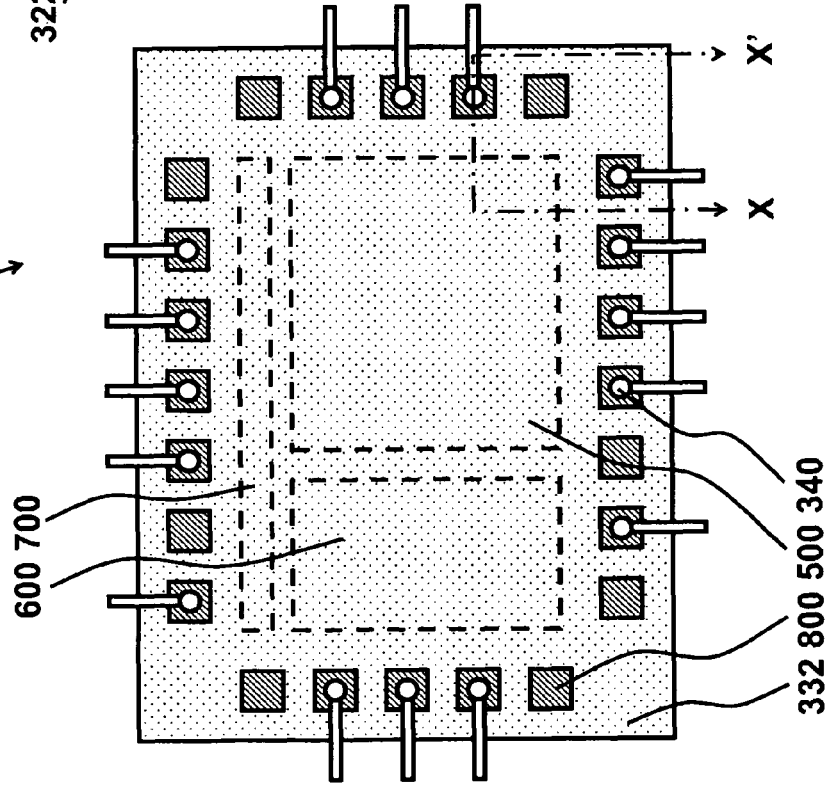
FIG.11A
FIG.11B

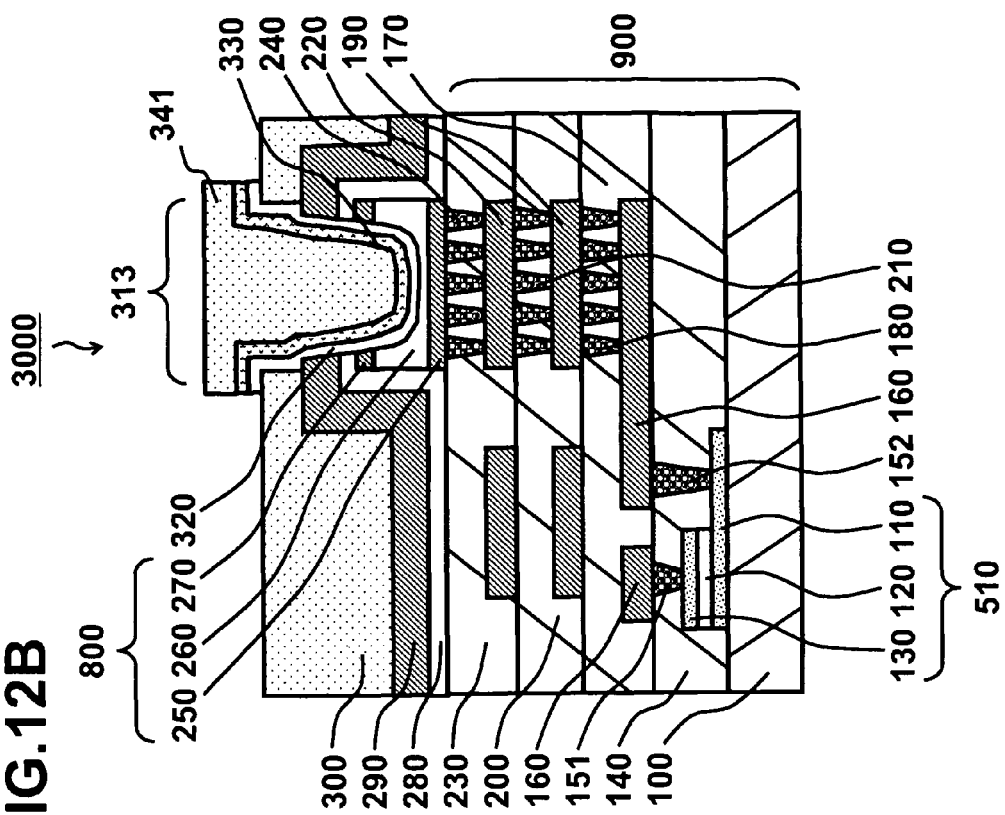
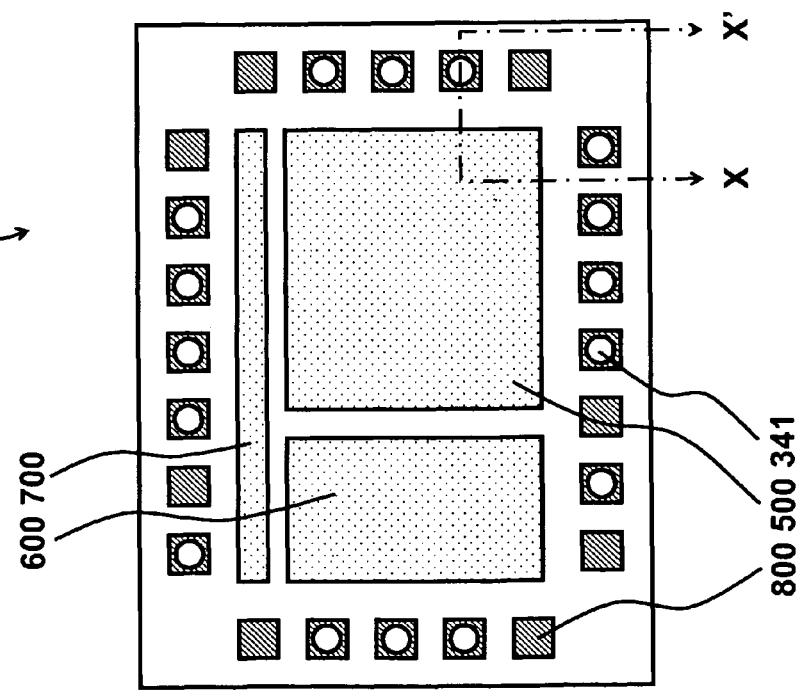
FIG.12A
FIG.12B

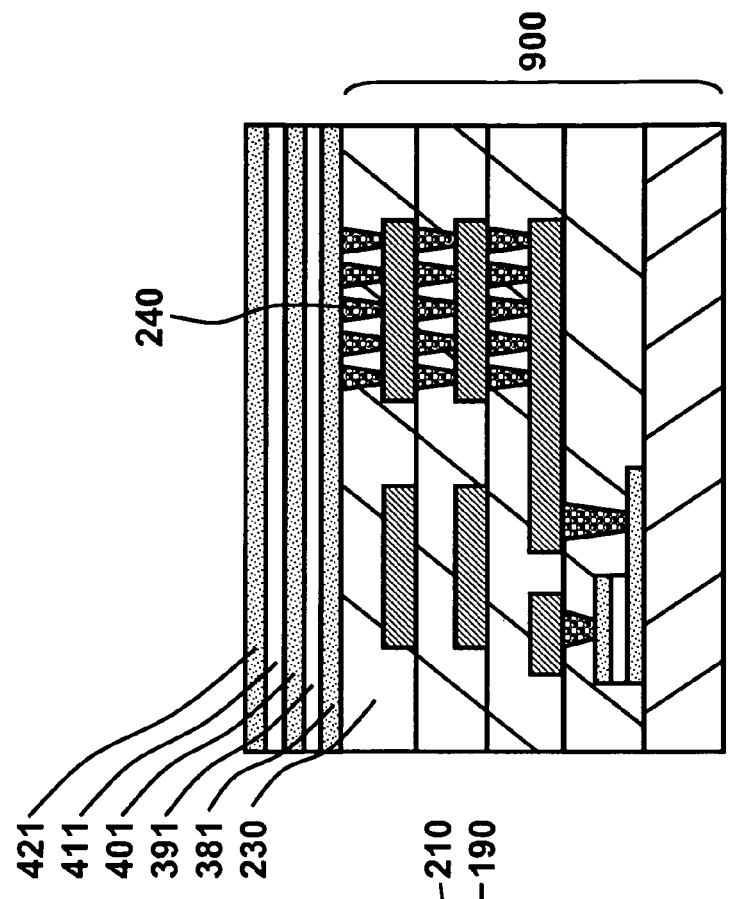
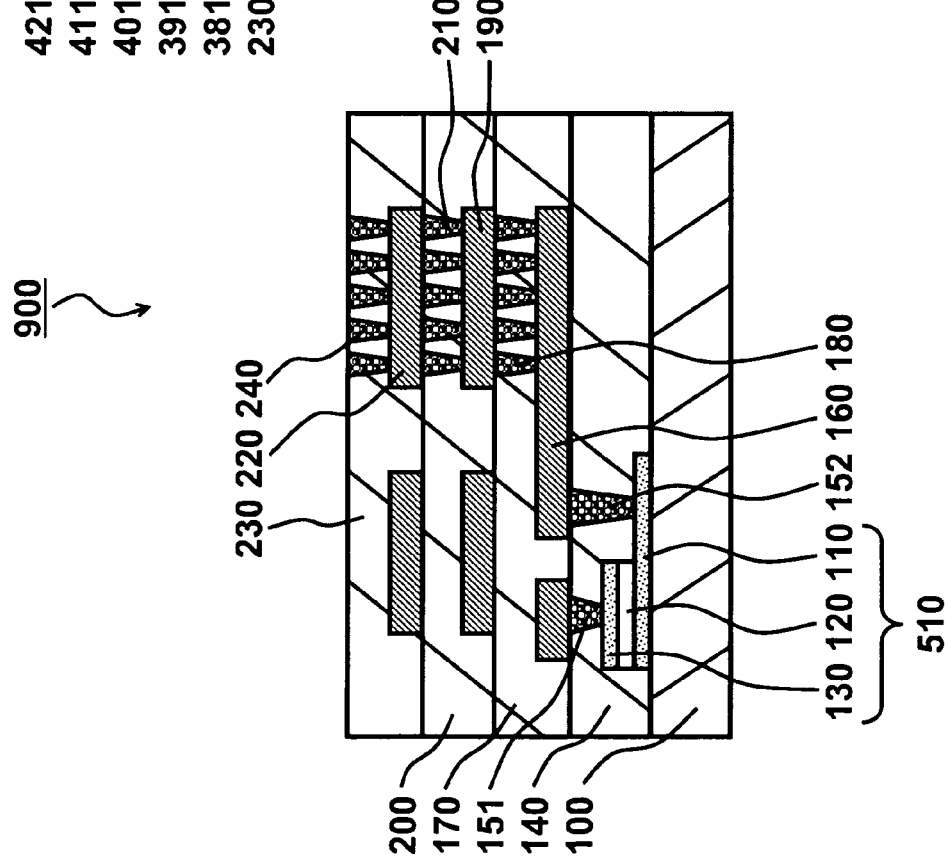

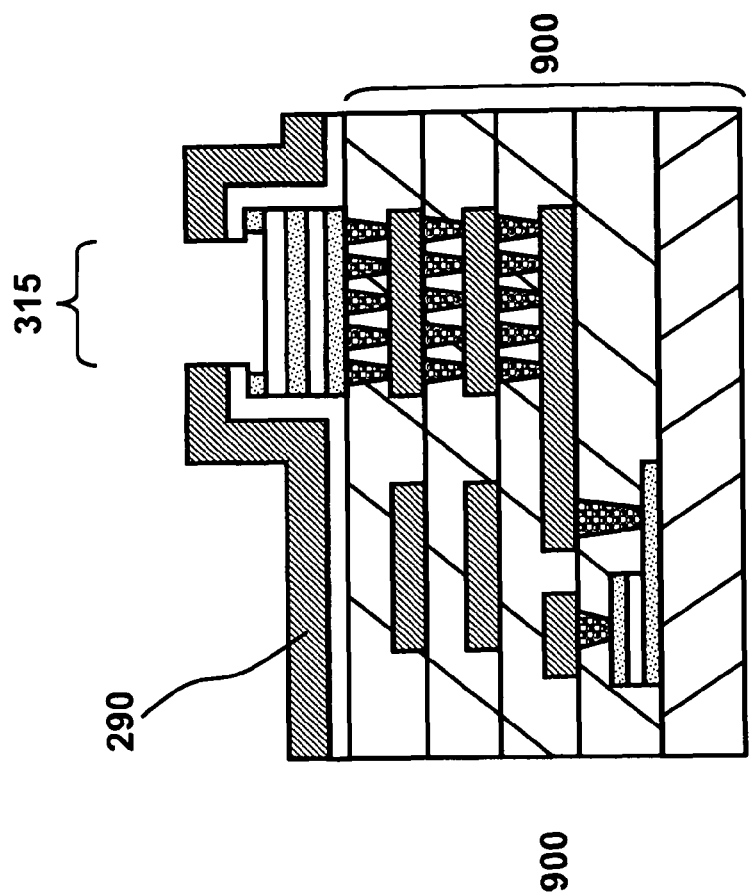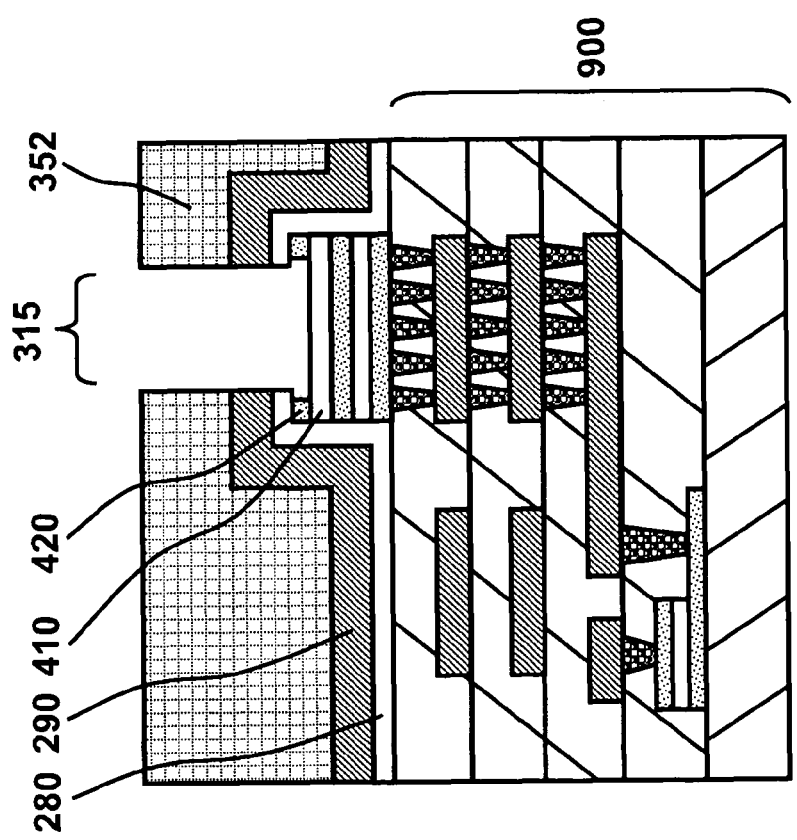
FIG.17A
FIG.17B

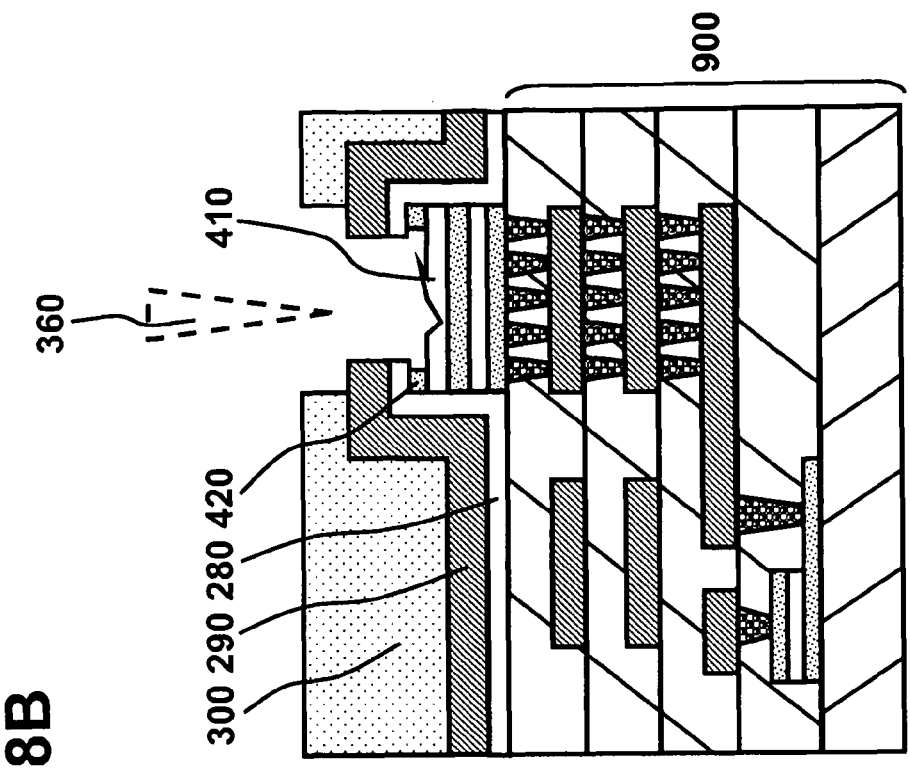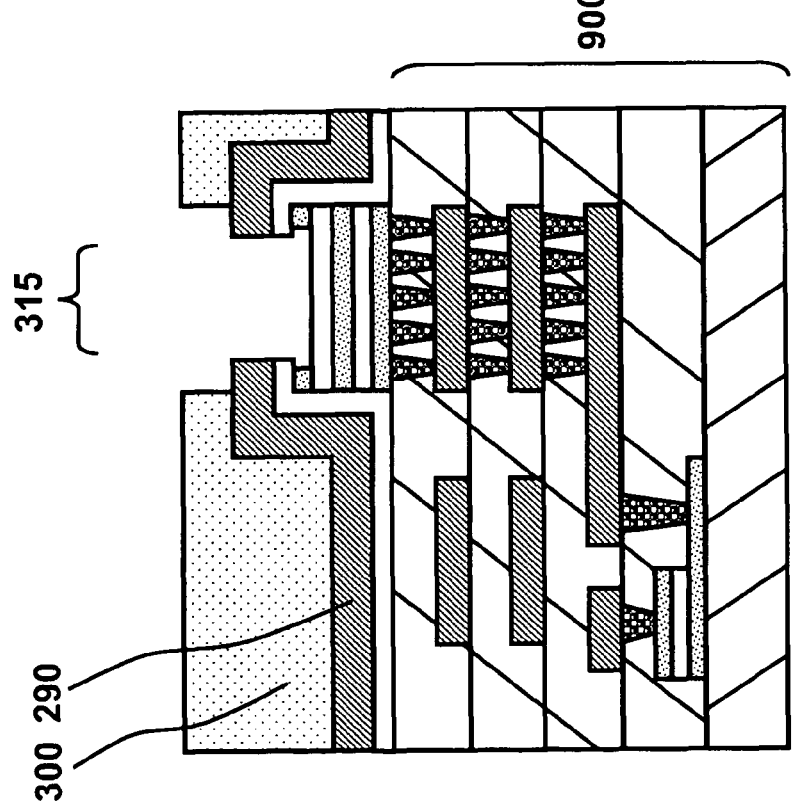
FIG.18A
FIG.18B

_US 7,829,476 B2_

METHOD OF MANUFACTURING SEMICONDUCTOR DEVICE AND SEMICONDUCTOR DEVICE

CROSS-REFERENCE TO RELATED APPLICATION

This application is based upon and claims the benefit of priority of the prior Japanese Patent Application No. 2008-78122 filed on Mar. 25, 2008, the entire contents of which are incorporated herein by reference.

BACKGROUND

1. Field

An aspect of the embodiments discussed herein is directed to a method of manufacturing a semiconductor device and a semiconductor device related to hydrophobic treatment of the semiconductor device.

2. Description of the Related Art

In recent years, in order to improve element characteristics of a ferroelectric memory (ferroelectric random access memory (FRAM)) in which information is retained in ferroelectric film capacitors using ferroelectric polarization inversion, development has been pursued. The ferroelectric memory is a non-volatile memory in which information stored therein is not lost even when a power supply is removed. In the ferroelectric memory, capacitors each having two electrodes and a ferroelectric film interposed therebetween are provided. As a material for the ferroelectric film forming the capacitor of the ferroelectric memory, for example, a ferroelectric oxide having a perovskite structure, such as lead titanate zirconate ($Pb(Zr, Ti)O_3$, hereinafter referred to as "PZT"), has been primarily used.

Inspection is performed a plurality of times for one ferroelectric memory, and only ferroelectric memories finally recognized as good products are packed for shipment. Hence, the ferroelectric memory as described above has pad electrodes to be brought into contact with a measurement terminal for inspection or to be connected to an external circuit on the same layer as the topmost wiring layer or a layer thereabove. Since the pad electrode is a connection portion to be brought into contact with a measurement terminal or to be connected to an external circuit, the upper surface of the pad electrode must be exposed.

When the inspection as described above is performed, a front end of a measurement terminal of a tester is brought into contact with the pad electrode; however, for example, when the number of inspections is large as in the case of a memory incorporating logic LSI, a hard measurement terminal is repeatedly brought into contact with the same pad.

When being brought into contact with the pad electrode as discussed above, the measurement terminal may break a metal film forming the surface of the pad electrode and a barrier metal provided thereunder, and a wire disposed under the pad electrode may be exposed in some cases. That is, the metal film is broken and curled up, and the wire provided thereunder is exposed. When wire bonding is performed in an assembly operation on the pad electrode in the state discussed above, the adhesion of a bonding wire is degraded.

A semiconductor device and a manufacturing method thereof have been discussed, for example, in Japanese Laid-open Patent Publication No. 2004-296643, in which after a curled-up metal film forming a surface of a pad electrode is selectively removed, a wire bonding operation is performed.

According to the configuration discussed in Japanese Laid-open Patent Publication No. 2004-296643, the adhesion of a bonding wire may be improved. However, in the semiconductor device having a ferroelectric film as discussed above, when moisture enters the pad electrode through the surface thereof, it may probably reach a wire, a transistor, and a capacitor having a ferroelectric film through interlayer insulating films in some cases. When moisture reaches the capacitor having a ferroelectric film, particularly, characteristics of the ferroelectric film are degraded. The reason for this is believed that due to hydrogen derived from the moisture that entered as discussed above, the ferroelectric film is reduced, oxygen defects occur thereby, and the crystallinity is degraded. As a result, degradation of characteristics, such as the remanent polarization and the dielectric constant, occur. In addition, when hydrogen enters, the characteristics of the capacitor having a ferroelectric film is more directly degraded as compared to the case of moisture.

SUMMARY

According to an aspect of an embodiment, a method of manufacturing a semiconductor device has forming a capacitor having electrodes and a ferroelectric film provided therebetween above a substrate, forming a pad electrode electrically connected to one of the electrodes of the capacitor above the substrate, forming a protective film covering the pad electrode over the substrate, forming an opening in the protective film exposing at least a part of the pad electrode, bringing a measurement terminal into contact with the exposed surface of the pad electrode, etching the surface of the pad electrode after the measurement terminal is brought into contact therewith, and forming a hydrogen absorbing film on the protective film and the pad electrode exposed through the opening.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1A is a plan view of a semiconductor device according to a first example;

FIG. 1B is a cross-sectional view of the semiconductor device according to the first example;

FIGS. 2A-2B are views each showing an operation of manufacturing the semiconductor device according to the first example;

FIGS. 8A-8B are views each showing an operation of manufacturing the semiconductor device according to the first example;

FIG. 11A is a plan view of a semiconductor device according to a second example;

FIG. 11B is a cross-sectional view of the semiconductor device according to the second example;

FIG. 12A is a plan view of a semiconductor device according to a third example;

FIG. 12B is a cross-sectional view of the semiconductor device according to the third example;

FIGS. 14A-14B are views each showing an operation of manufacturing the semiconductor device according to the fourth example;

FIGS. 16A-16B are views each showing an operation of manufacturing the semiconductor device according to the fourth example of;

FIGS. 17A-17B are views each showing an operation of manufacturing the semiconductor device according to the fourth example;

FIGS. 18A-18B are views each showing an operation of manufacturing the semiconductor device according to the fourth example;

DESCRIPTION OF THE PREFERRED EMBODIMENTS

Figure 3A:
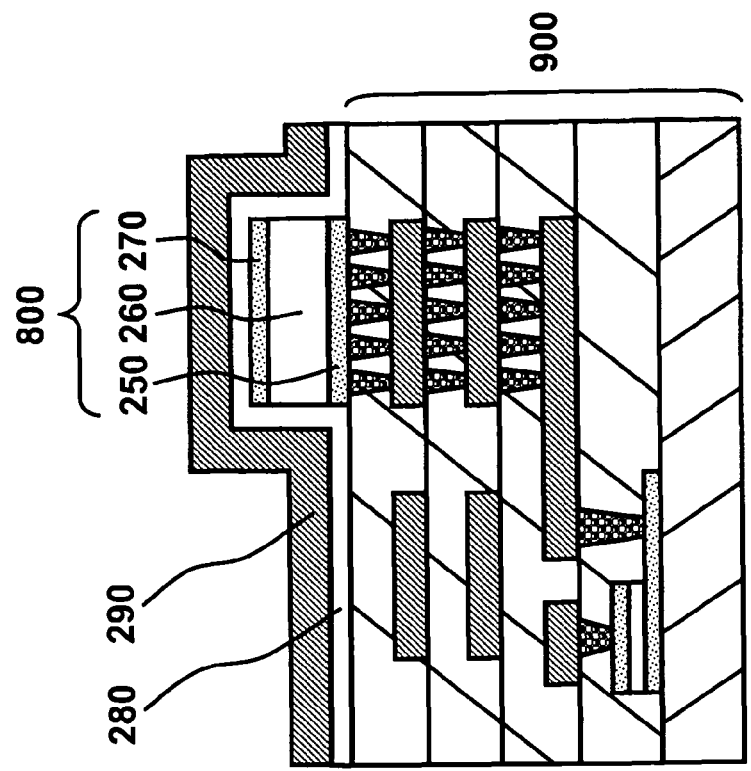
FIGS. 3A-3B are views each showing an operation of manufacturing the semiconductor device according to the first example.

Hereinafter, examples each relating to a method of manufacturing a semiconductor device and the structure of a semiconductor device, according to the present technique, will be described. However, the present technique is not limited to the following examples.

In the examples of the present technique, FIGS. 1 to 10 are views illustrating the structure of a semiconductor device 1000 and a method of manufacturing the semiconductor device 1000 in detail.

According to the method of manufacturing the semiconductor device 1000 and the semiconductor device 1000 of a first example, since surfaces of recesses of pad electrodes 800 may be smoothly formed when scratches and the like on the surfaces thereof are removed, hydrogen absorbing films 330 may be continuously formed on the respective pad electrodes 800. As a result, intrusion of moisture and hydrogen from the outside of the semiconductor device 1000 may be prevented. Hence, the reliability of a capacitor 510 having a ferroelectric film may be improved.

FIGS. 1A and 1B are views each illustrating the structure of the semiconductor device 1000 according to the first example. FIG. 1A is a plan view of the semiconductor device 1000. FIG. 1B is a cross-sectional view taken along the line X-X' shown in FIG. 1A.

FIG. 1A is a plan view showing the shape of the semiconductor device 1000 according to the first example. The semiconductor device 1000 includes a ferroelectric memory (FRAM) circuit portion 500 formed on a semiconductor chip, a logic circuit portion 600, a peripheral circuit portion 700, and the pad electrodes 800. The pad electrodes 800 are provided in a peripheral portion of the semiconductor device 1000. In this example, the peripheral portion indicates a region in the vicinity of sides of the semiconductor chip and is a region other than the ferroelectric memory circuit portion 500, the logic circuit portion 600, and the peripheral circuit portion 700.

FIG. 1B is a cross-sectional view of the semiconductor device 1000 according to the first example, taken along the line X-X' in FIG. 1A. The capacitor 510 including a lower electrode 110, a ferroelectric film 120, and an upper electrode 130 laminated in that order over the wiring structure 900 from a bottom side is formed on a lower interlayer insulating film 100 under which functional elements, such as transistors, are formed (not shown).

A first interlayer insulating film 140 is formed on the lower interlayer insulating film 100 so as to cover the capacitor 510 having a ferroelectric film. A first contact plug 151 is formed to penetrate the first interlayer insulating film 140. In addition, the first contact plug 151 is also formed to reach the upper electrode 130. A first contact plug 152 is formed to penetrate the first interlayer insulating film 140 and is also formed to reach the lower electrode 110.

A first metal wire 160 is formed on the first interlayer insulating film 140 so as to be connected to the first contact plug 151 or the first contact plug 152. A second interlayer insulating film 170 is formed so as to cover the first metal wire 160. Second contact plugs 180 are formed to penetrate the second interlayer insulating film 170 and to reach the first metal wire 160.

A second metal wire 190 is formed on the second interlayer insulating film 170. A third interlayer insulating film 200 is formed so as to cover the second metal wire 190. The third interlayer insulating film 200 is formed, for example, of silicon oxide. Third contact plugs 210 are formed to penetrate the third interlayer insulating film 200 so as to reach the second metal wire 190.

A third metal wire 220 is formed on the third interlayer insulating film 200 so as to be connected to the third contact plugs 210. A fourth interlayer insulating film 230 is formed so as to cover the third metal wire 220. Fourth contact plugs 240 are formed to penetrate the third interlayer insulating film 200 so as to reach the third metal wire 220.

The pad electrode 800 is formed of a first conductive film 250, a conductive pad 260, and a second conductive film 270 laminated to each other in this order. The first conductive film 250 is formed on the fourth interlayer insulating film 230 so as to be connected to the fourth contact plugs 240. The conductive pad 260 is formed on the first conductive film 250. In addition, the conductive pad 260 has a recess. The second conductive film 270 is formed on the conductive pad 260. The second conducive film 270 is formed on a flat portion of the conductive pad 260, that is, on part of the conductive pad 260 except for the recess.

A first protective film 280 is formed on the fourth interlayer insulating film 230, on the second conductive film 270, and on the side wall of the pad electrode 800. A second protective film 290 is formed on the first protective film 280. A third protective film 300 is formed on the second protective film 290. In addition, an opening portion 310 is formed in the third protective film 300, the second protective film 290, the first protective film 280, and the second conductive film 270 and exposes the surface of the recess of the conductive pad 260.

An adhesion film 320 is formed so as to cover the inside of the opening portion 310 of the third protective film 300. That is, the adhesion film 320 is formed so as to closely adhere to the surface of the recess of the conductive pad 260, and the side surfaces of the second conductive film 270, the first protective film 280, the second protective film 290, and the third protective film 300.

The hydrogen absorbing film 330 is formed on the adhesion film 320.

A bonding wire 340 is formed on the hydrogen absorbing film 330 so as to be connected to the pad electrode 800. Since the opening portion 310 is present, the first protective film 280, the second protective film 290, and the third protective film 300 are not present above the recess of the of the conductive pad 260 of the pad electrode 800. However, since there are provided the hydrogen absorbing film 330 and the adhesion film 320 covering the inside of the opening portion 310 so as to closely adhere thereto, intrusion of moisture through the pad electrode 800 may be prevented.

With reference to FIGS. 2A to 10, a method of manufacturing the semiconductor device 1000 according to an embodiment will be described in the order of an operation.

FIG. 2A shows the state in which the capacitor 510 having a ferroelectric film and the wiring layers are formed on the lower interlayer insulating film 100 as the wiring structure 900. These operations of forming the wiring layers of the capacitor having a ferroelectric film will be described. First, as shown in FIG. 2A, the lower electrode 110 is formed, for example, by a physical vapor deposition (PVD) to have a thickness of 100 nm to 200 nm on the lower interlayer insulating film 100 under which functional elements, such as transistors (not shown) are formed. The lower electrode 110 is preferably formed, for example, of Pt. Next, the ferroelectric film 120 of the capacitor 510 is formed, for example, by a PVD method to have a thickness of 150 nm to 300 nm. The ferroelectric film 120 is preferably formed of lead titanate zirconate (PZT). Next, the upper electrode 130 is formed on the ferroelectric film 120 so as to have a thickness of, for example, 50 nm. The upper electrode 130 is preferably formed of iridium oxide ($IrO_x$). In addition, the lower electrode 110, the ferroelectric film 120, and the upper electrode 130 are patterned in a photolithographic operation and an etching operation. Accordingly, the capacitor 510 having a ferroelectric film is formed to have a stack structure in which the ferroelectric film 120 is provided between the upper electrode 130 and the lower electrode 110.

Next, the first interlayer insulating film 140 is formed, for example, by a chemical vapor deposition (CVD) method on the entire surface so as to have a thickness of, for example, 1,500 nm. The first interlayer insulating film 140 is preferably formed, for example, of $SiO_2$. After being formed on the entire surface by a CVD method, the first interlayer insulating film 140 is planarized by chemical mechanical polishing (CMP).

Subsequently, a contact hole reaching the upper electrode 130 and a contact hole reaching the lower electrode 110 are formed in the first interlayer insulating film 140 by a patterning and an etching technique.

Next, as adhesive layers, for example, TiN films are formed inside the contact holes. Subsequently, W films are filled in the contact holes, for example, by a CVD method, and planarization is then performed by a CMP method, so that the first contact plug 152 connected to the lower electrode 110 is formed. At the same time, the first contact plug 151 connected to the upper electrode 130 is also formed.

Subsequently, the first metal wire 160 connected to the first contact plug 151 or 152 is formed on the first interlayer insulating film 140 by a PVD method, a patterning technique, and an etching technique. The first metal wire 160 is preferably formed, for example, by sequentially laminating a TiN film of 150 nm thick, an Al alloy film of 550 nm thick, Ti of 5 nm thick, and TiN of 150 nm thick. The Al alloy film is preferably, for example, an alloy including 95.5% of Al and 0.5% of Cu.

Next, the second interlayer insulating film 170 is formed on the entire surface by a CVD method so as to have a thickness of, for example, 1,500 nm.

Contact holes reaching the first metal wire 160 are then formed in the second interlayer insulating film 170 by a patterning and an etching technique. Next, W films are filled in the contact holes, for example, by a CVD method, followed by performing planarization by a CMP method, so that the second contact plugs 180 connected to the first metal wire 160 are formed.

Subsequently, the second metal wire 190 connected to the second contact plugs 180 is formed on the second interlayer insulating film 170 by a PVD method, a patterning technique, and an etching technique. The second metal wire 190 is formed, for example, of a material similar to that of the first metal wire 160. Next, the third interlayer insulating film 200 is formed on the entire surface, for example, by a CVD method so as to have a thickness of, for example, 1,500 nm.

Contact holes reaching the second metal wire 190 are then formed in the third interlayer insulating film 200 by a patterning and an etching technique. Next, W films are filled in the contact holes, for example, by a CVD method, followed by performing planarization by a CMP method, so that the third contact plugs 210 connected to the second metal wire 190 are formed.

Subsequently, the third metal wire 220 connected to the third contact plugs 210 is formed on the third interlayer insulating film 200 by a PVD method, a patterning technique, and an etching technique. The third metal wire 220 is formed, for example, of a material similar to that of the second metal wire 190. Next, the fourth interlayer insulating film 230 is formed on the entire surface, for example, by a CVD method so as to have a thickness of, for example, 1,500 nm.

Contact holes reaching the third metal wire 220 are then formed in the fourth interlayer insulating film 230 by a patterning and an etching technique. Next, W films are filled in the contact holes, for example, by a CVD method, followed by performing planarization by a CMP method, so that the fourth contact plugs 240 connected to the third metal wire 220 are formed.

FIG. 2B shows the state in which conductive films forming the pad electrode 800 are deposited over the wiring structure 900. A TiN film 251 is first formed on the entire surface of the fourth interlayer insulating film 230 by a PVD method to have a thickness of 100 nm. Next, an Al alloy film 261 is formed on the TiN film 251 by a PVD method to have a thickness of 500 nm. The Al alloy film 261 is preferably an alloy including, for example, 95.5% of Al and 0.5% of Cu. A TiN film 271 is then formed on the Al alloy film 261 by a PVD method to have a thickness of 100 nm. The reason for this is that since the Al alloy film 261 is liable to be oxidized, oxidation of the Al alloy film 261 may be suppressed by forming the TiN film 271 thereon.

FIG. 3A shows the state in which the pad electrode 800 is formed over the wiring structure 900. As shown in FIG. 3A, by a patterning and an etching technique, a patterned resist is formed on the TiN film 271 thus deposited, and the conductive films (the TiN film 251, the Al alloy film 261, and the TiN film 271) are etched by using the resist as a mask, so that the pad electrode 800 composed of the first conductive film 250, the conductive pad 260, and the second conductive film 270 is formed. The pad electrode 800 preferably has a rectangular shape having a side of 80 to 100 µm long. As described above, the pad electrode 800 connected to the fourth contact plugs 240 is formed.

Figure 3B:
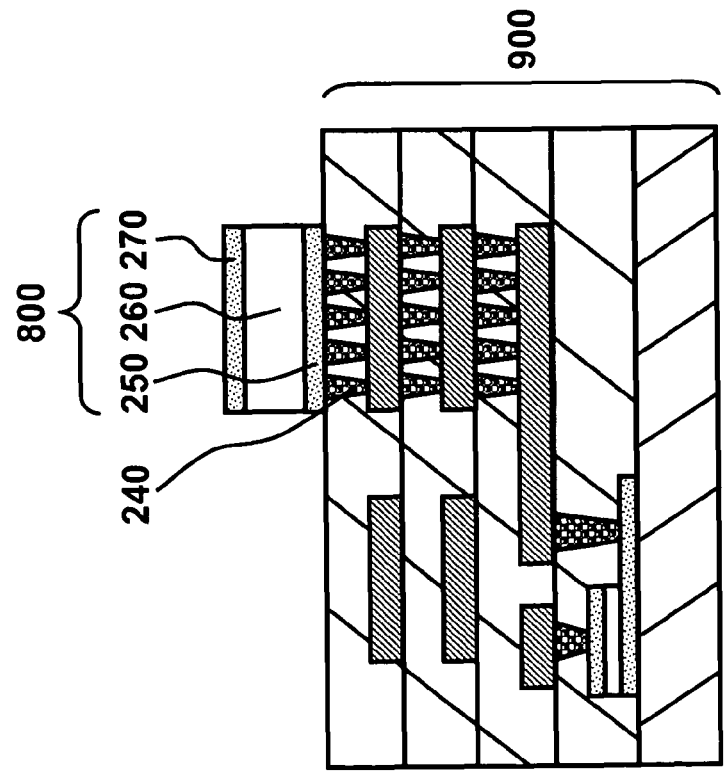

FIG. 3B shows the state in which the first protective film 280 and the second protective film 290 are deposited over the wiring structure 900. As shown in FIG. 3B, the first protective film 280 is first formed on the pad electrode 800 and the surface of the fourth interlayer insulating film 230, for example, by a CVD method so as to have a thickness of 100 nm to 300 nm. The first protective film 280 is formed, for example, using P (plasma)-TEOS (tetraethoxysilane)-NSG (non-doped silicate glass). The first protective film 280 is formed by a method in which tetraethoxysilane and $O_2$, used as source gases, are allowed to react with each other. Subsequently, in order to nitride the surface of the first protective film 280, $N_2O$ plasma annealing is performed, for example, in a CVD apparatus. The plasma annealing is performed, for example, at 350° C. for 2 minutes. The second protective film 290 is then formed on the first protective film 280 by a plasma CVD method to have a thickness of 400 nm to 1,000 nm. The second protective film 290 may be formed, for example, using P-SiN (silicon nitride).

Figure 4A:
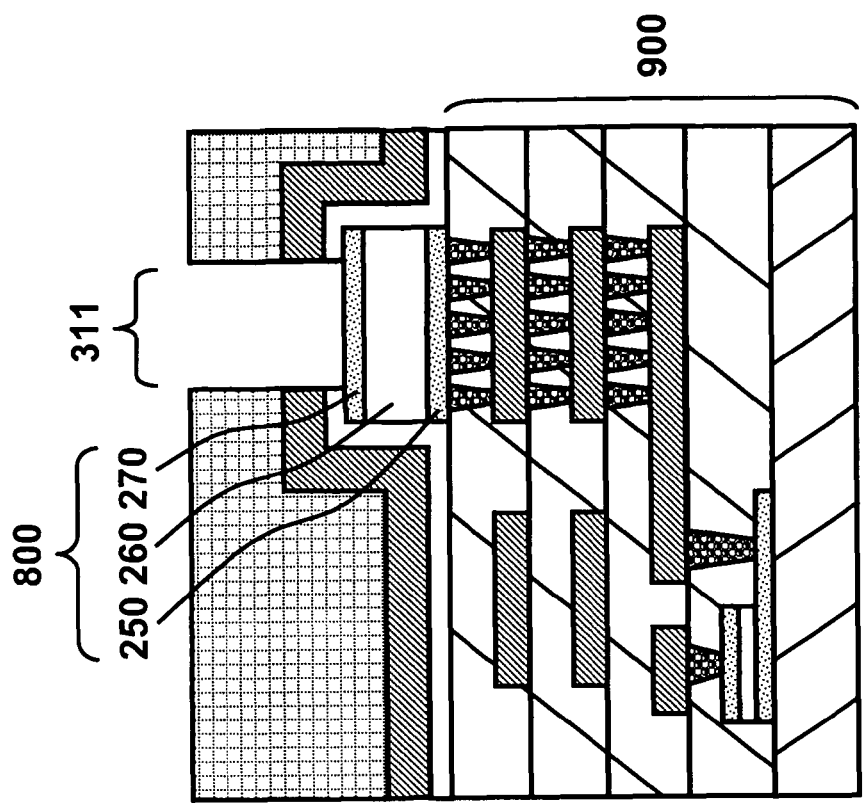
FIGS. 4A-4B are views each showing an operation of manufacturing the semiconductor device according to the first example.

FIG. 4A shows the state in which a resist 350 and an opening portion 311 penetrating the resist 350 are formed over the wiring structure 900. As shown in FIG. 4A, the resist 350 is formed on the second protective film 290 by a photolithographic technique. As a result, the opening portion 311 penetrating the resist 350 is formed to have a width of 70 to 90 µm.

Figure 4B:
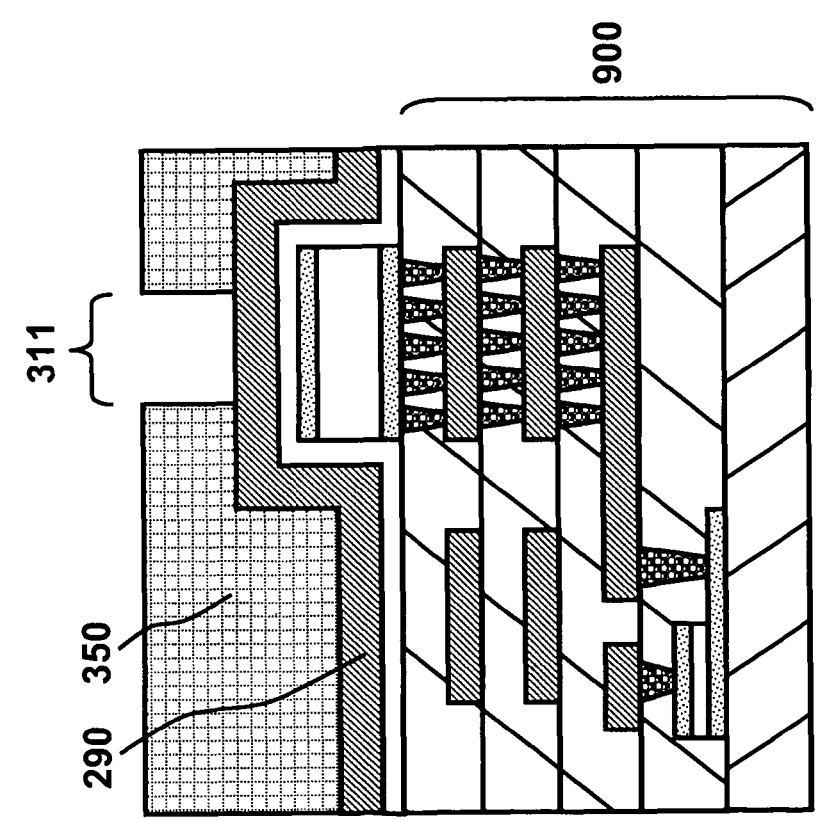

FIG. 4B shows the state in which the surface of the pad electrode 800 is exposed. As shown in FIG. 4B, by anisotropic etching using the resist 350 as a mask, the opening portion 311 is formed into an opening portion penetrating the first protective film 280 and the second protective film 290.

Figure 5B:
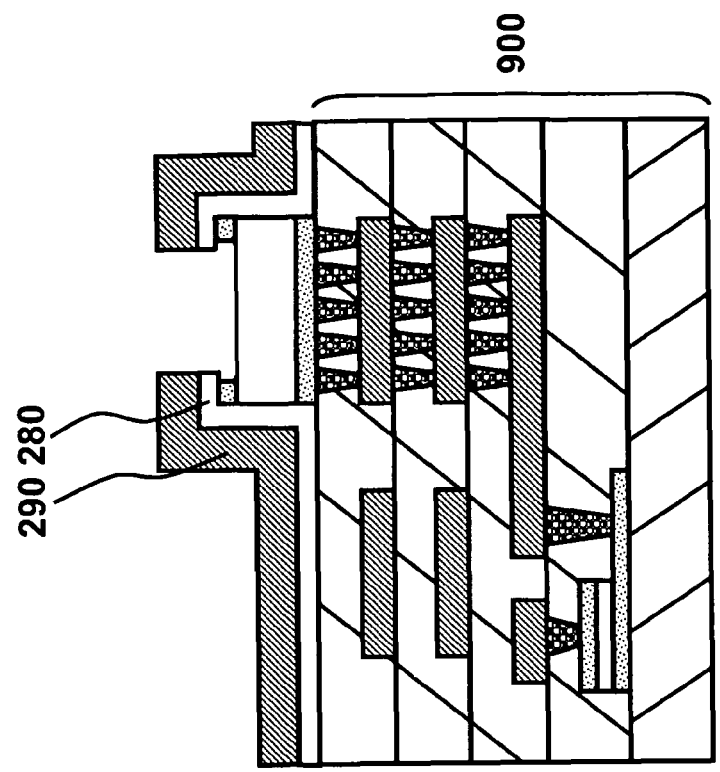
FIGS. 5A-5B are views each showing an operation of manufacturing the semiconductor device according to the first example.
Figure 5A:
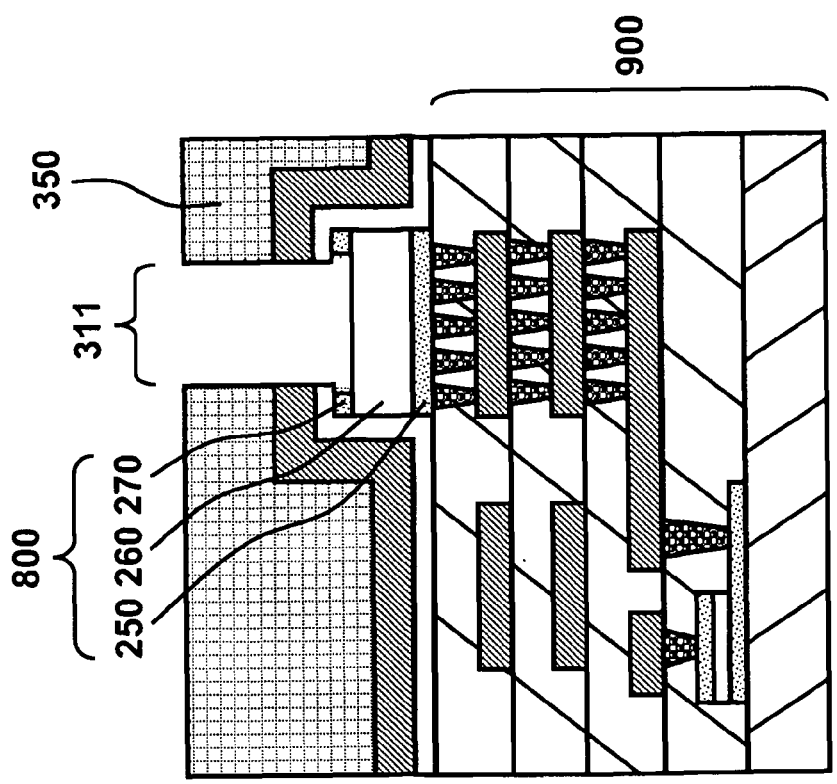

FIG. 5A shows the state in which the second conductive film 270 of the pad electrode 800 is partly etched. As shown in FIG. 5A, by isotropic etching using the resist 350 as a mask, an opening is formed in the second conductive film 270. This isotropic etching is performed by a down-flow method, and for example, a mixture of $CF_4$ and $O_2$ is used as an etching gas. The ratio between a $CF_4$ gas and an $O_2$ gas is preferably set to, for example, 9 to 1. This isotropic etching is performed at a pressure of 100 millitorr and an etching time of 5 seconds under condition in which the temperature of the semiconductor substrate 100 is set to, for example, 200° C. By this operation, the surface of the conductive pad 260 is exposed. In addition, the second conductive film 270 withdraws from the side surface of the first protective film 280 and that of the second protective film 290 by 70 nm to 90 nm and by up to approximately 150 nm. The withdrawal of the side surface of the second conductive film 270 causes generation of cracks in the adhesion film 320 and the hydrogen absorbing film 330, which will be described later, when they are formed inside the opening portion 310.

As shown in FIG. 5B, the resist 350 on the second protective film 290 is removed.

Figure 6A:
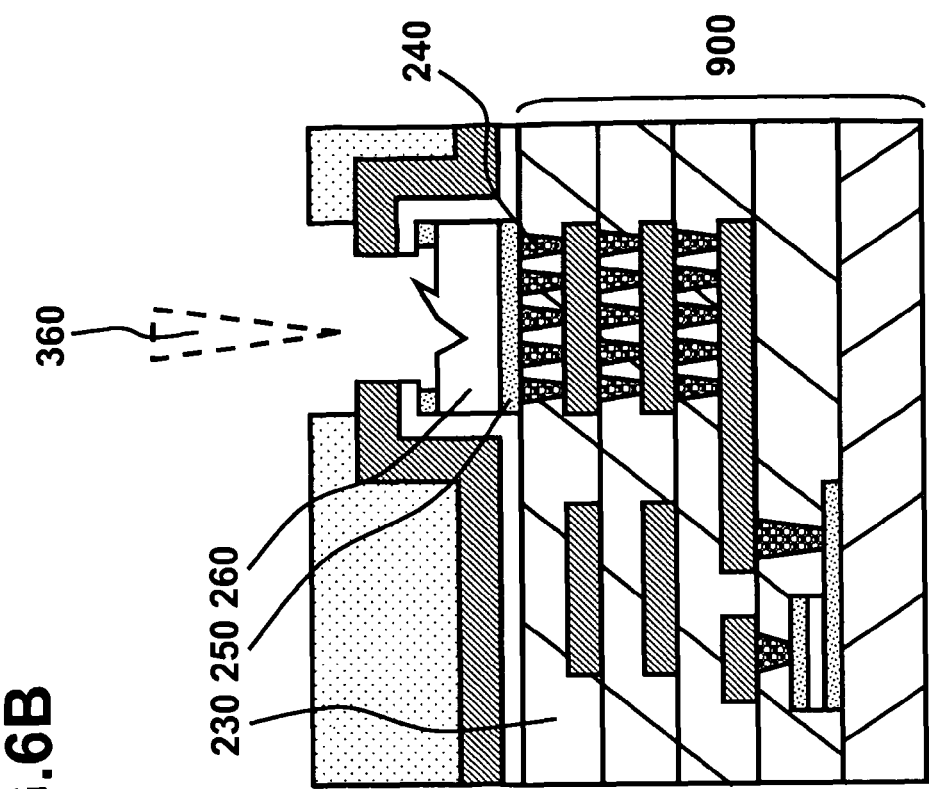
FIGS. 6A-6B are views each showing an operation of manufacturing the semiconductor device according to the first example.

FIG. 6A shows the state in which the third protective film 300 having an opening portion is formed above the pad electrode 800. As shown in FIG. 6A, the third protective film 300 is formed by the operations of applying a photosensitive polyimide onto the second protective film 290 and then removing a polyimide layer on the pad electrode 800 by exposure and development. The thickness of the third protective film 300 is preferably in the range of, for example, 2,000 nm to 4,000 nm. Next, the photosensitive polyimide forming the third protective film 300 is cured, for example, in a horizontal furnace in a $N_2$ atmosphere (flow rate: 100 liters per minute) at 310° C. for 40 minutes.

Figure 6B:
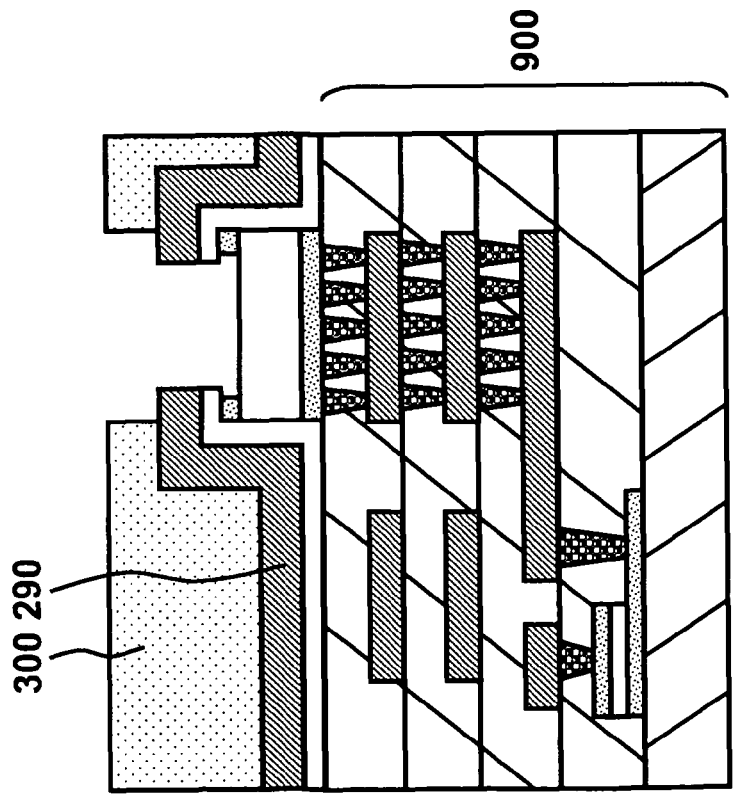

FIG. 6B shows the state in which inspection is performed, for example, to confirm functions of the semiconductor device 1000 formed on a wafer surface. Since the semiconductor device 1000 according to this embodiment incorporates non-volatile memories, operation associated with data storage functions must be confirmed. In the test as described above, a front end of a measurement terminal 360 of a tester is brought into contact with the pad electrode. For example, when the number of tests is large as in the case of a memory incorporating logic LSI, the hard measurement terminal 360 must be brought into contact with the same pad electrode many times. However, since the first conductive film 250 provided under the conductive pad 260 is harder than the measurement terminal 360, the measurement terminal 360 is stopped by the hard first conductive film 250, and the fourth interlayer insulating film 230 and the fourth contact plugs 240, which are provided under the first conductive film 250, are not damaged.

Figure 7A:
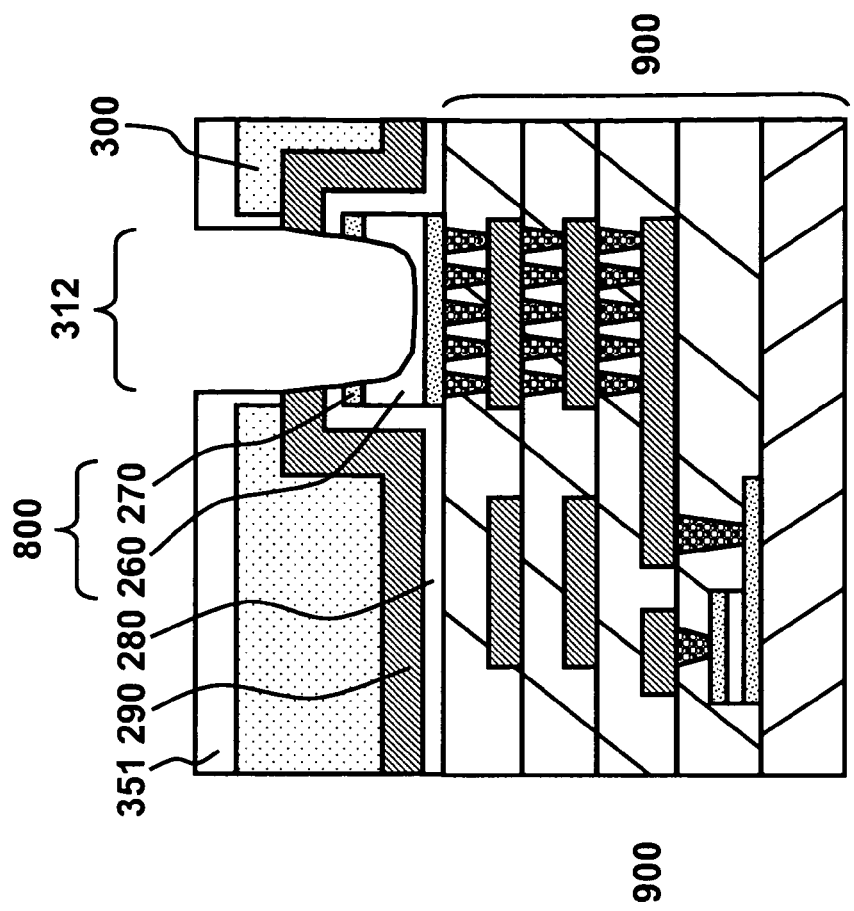
FIGS. 7A-7B are views each showing an operation of manufacturing the semiconductor device according to the first example.

FIG. 7A shows the state in which a resist 351 having an opening portion 312 is formed above the pad electrode 800. As shown in FIG. 7A, the resist 351 which is patterned by a photolithographic technique is formed on the third protective film 300 and the second protective film 290. In addition, the resist 351 has an opening portion 312 of 80 to 100 µm in width above the pad electrode 800. By this operation, the side surfaces of the first protective film 280, the second protective film 290, and the second conductive film 270, and the conductive pad 260 are exposed through the opening portion 312. In addition, the width of the opening portion 312 is approximately equivalent to that of the opening portion of the second conductive film 270.

Figure 7B:
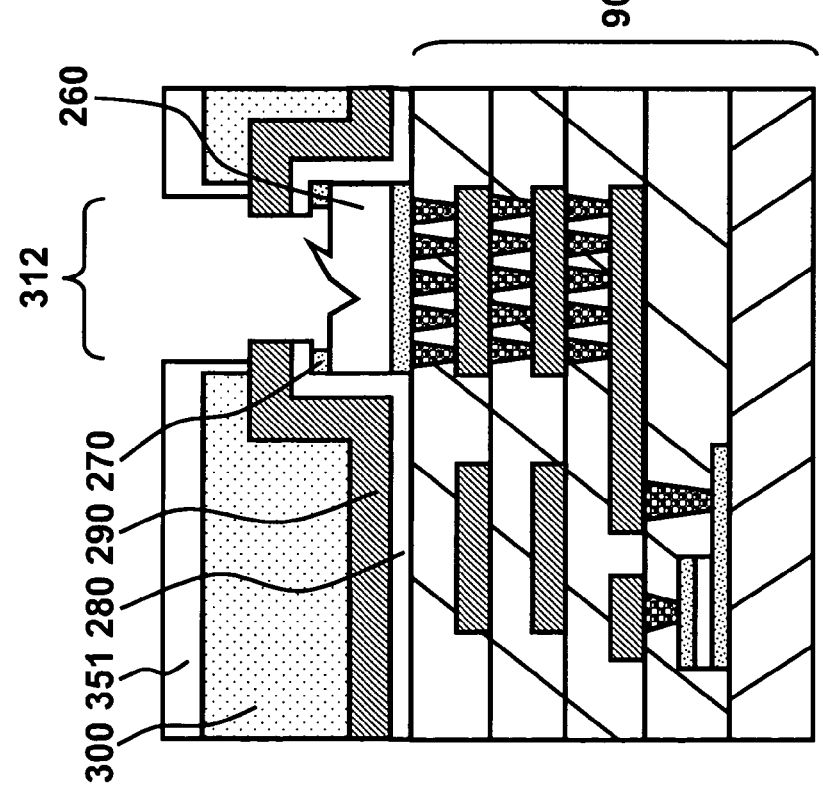

FIG. 7B shows an operation of etching the surface of the pad electrode 800. As shown in FIG. 7B, in order to smooth corners of the side surfaces of the conductive pad 260, the second conductive film 270, the first protective film 280, and the second protective film 290, Ar (argon) sputtering is performed, for example, in an inductively coupled plasma etching apparatus. As the Ar sputtering conditions, for example, a source power is set to 2,000 W, a bias power is set to 300 W, a reaction pressure is set to 10 millitorr, an Ar flow rate is set to 90 to 99 sccm, an etching rate is set to 500 nm/minute, and a wafer temperature is set to 20 to 250° C. In addition, in order to increase the etching rate of the conductive pad 260 and that of the second conductive film 270, 1 to 10 sccm of a chlorine gas is preferably added.

When the surface of the pad electrode 800 is etched under the conditions described above, the surface of the pad electrode 800 is smoothly recessed, so that a smooth surface portion thereof is obtained. In addition, since corner portions of the side walls of the first protective film 280 and the second protective film 290 are rounded, discontinuous surfaces disappear; hence, the recess of the conductive pad 260 of the pad electrode 800 and the side wall portion of the first conductive film 270 form a continuous surface. In addition, the side surfaces of the conductive pad 260, the second conductive film 270, the first protective film 280, and the second protective film 290 are preferably formed to have an angle of 80 to 85° by adjusting the etching conditions.

Next, as shown in FIG. 8A, the resist 351 on the second protective film 290 and the third protective film 300 is removed.

FIG. 8B shows the state in which a Ti film 321 is deposited. As shown in FIG. 8B, the Ti film 321 is formed on the entire surface, for example, by a PVD method to have a thickness of 150 nm to 200 nm. In addition, since the surface of the recess of the pad electrode 800 is smooth, the Ti film 321 is continuously formed thereon without being interrupted. The Ti film 321 is formed in order to improve the adhesion of the hydrogen absorbing film 330, which will be described later, with the conductive pad 260, the second conductive film 270, the first protective film 280, and the second protective film 290.

Figure 9A:
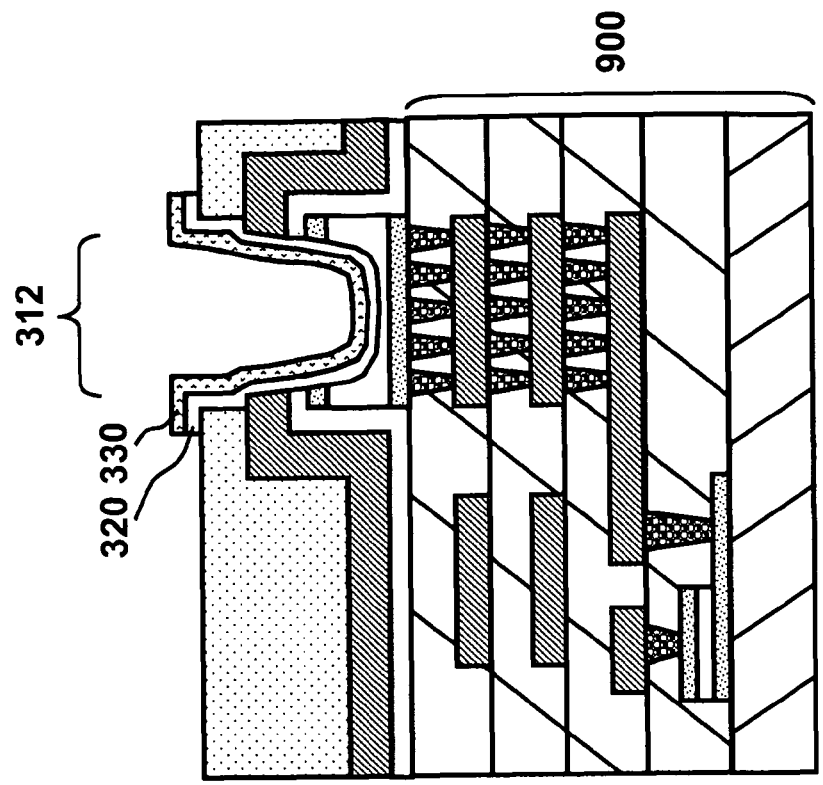
FIGS. 9A-9B are views each showing an operation of manufacturing the semiconductor device according to the first example.

FIG. 9A shows the state in which a Pd film 331 is deposited. As shown in FIG. 9A, the Pd film 331 is formed on the Ti film 321, for example, by a PVD method to have a thickness of 150 nm to 200 nm. The Pd film 331 has characteristics to absorb moisture and hydrogen. As a result, the Pd film 331 inhibits intrusion of moisture and hydrogen into the capacitor 510 having a ferroelectric film.

Figure 9B:
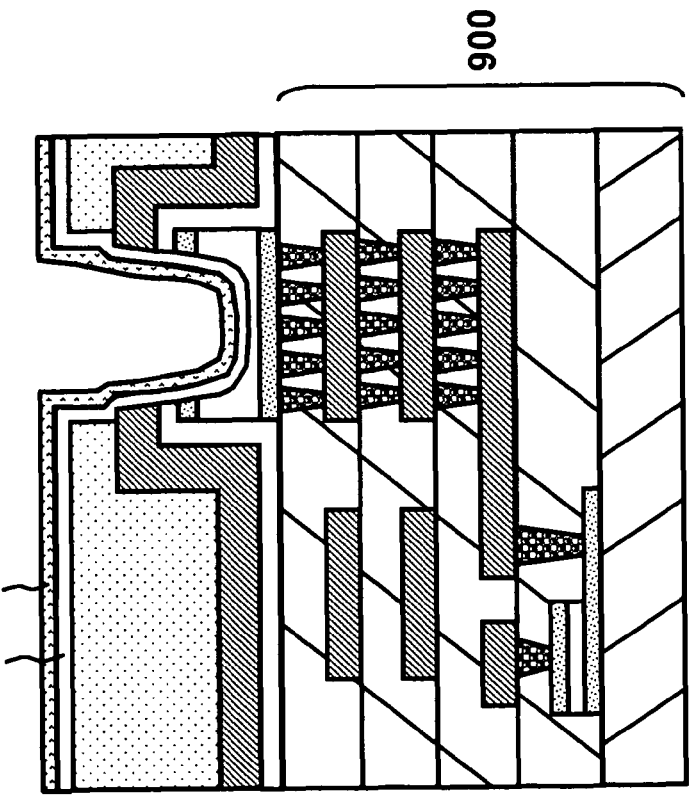

FIG. 9B shows the state in which the adhesion film 320 and the hydrogen absorbing film 330 are formed. As shown in FIG. 9B, the Ti film 321 and the Pd film 331 are patterned and etched, so that parts of the Ti film 321 and the Pd film 331 other than those provided inside the opening portion 312 are removed. The Ti film 321 may be etched when it is immersed in a mixed solution of ethylenediamine tetraacetic acid (EDTA), ammonia, hydrogen peroxide solution, and pure water for 9 minutes. The etching rate of the Ti film 321 was approximately 38 nm/minute. The Pd film 331 may be etched when it is immersed in a mixed solution of ammonium iodide, iodine, ethyl alcohol, and pure water for 9 minutes. The etching rate of the Pd film 331 was approximately 92.5 nm/minute. By the operations described above, the adhesion film 320 of Ti and the hydrogen absorbing film 330 of Pd are formed inside the opening portion 312.

Figure 10:
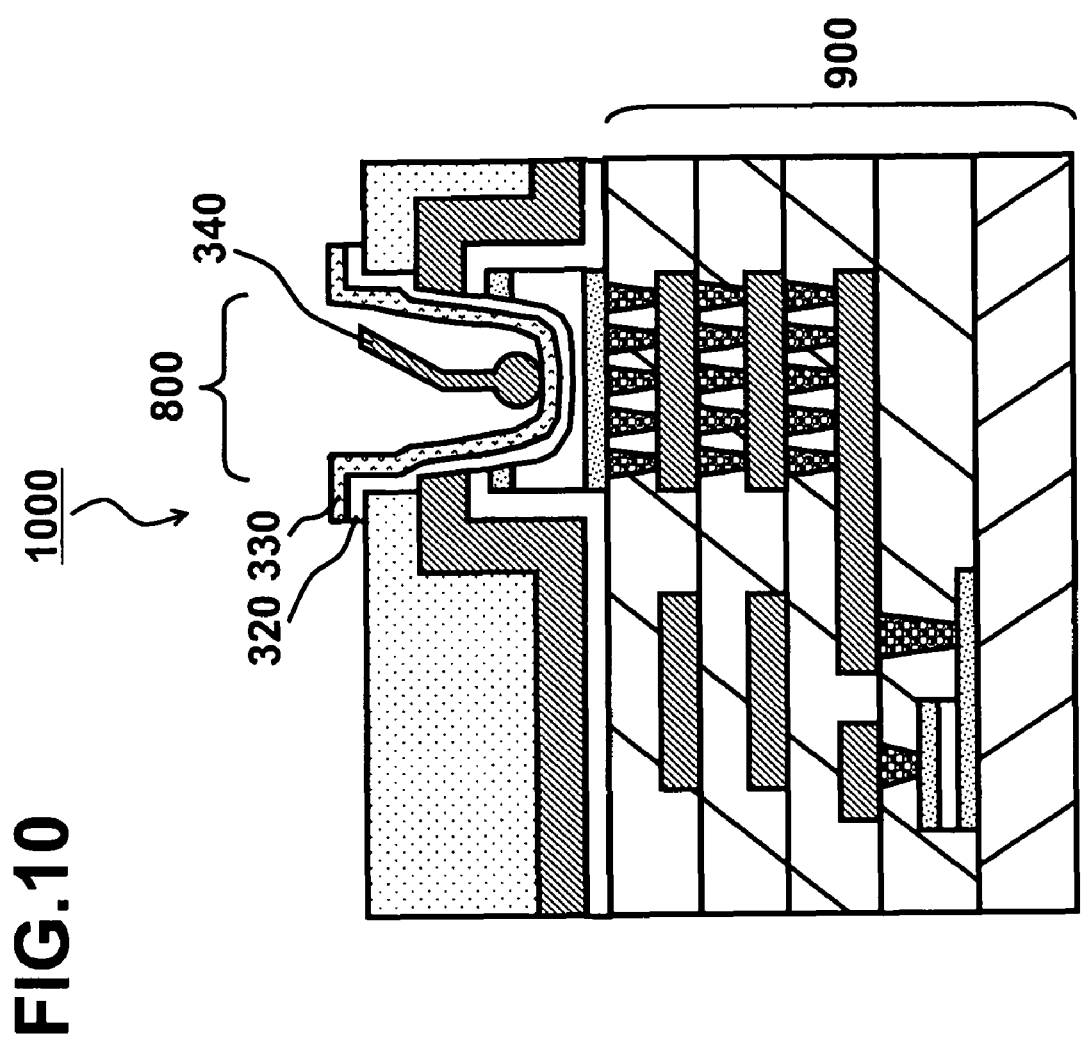
FIG. 10 is a view showing an operation of manufacturing the semiconductor device according to the first example.

FIG. 10 shows an operation of forming the bonding wire 340. As shown in FIG. 10, one end of the bonding wire 340 is bonded to the hydrogen absorbing film 330 provided above the pad electrode 800. The other end of the bonding wire 340 is bonded to a lead, a pad, or a land (not shown in the figure).

According to the method of manufacturing a semiconductor device of the first example, the surface of the recess of the pad electrode 800 may be made smooth when scratches and the like on the surface thereof is removed. Hence, the hydrogen absorbing film 330 covers the pad electrode 800 so as to closely adhere thereto with the adhesion film 320 interposed therebetween. As a result, intrusion of moisture and hydrogen through the pad electrode 800 into the capacitor having a ferroelectric film of the semiconductor device 1000 may be prevented. Accordingly, the reliability of the capacitor 510 having a ferroelectric film may be improved.

Hereinafter, a semiconductor device according to the second example will be described in detail with reference to the accompanying drawings.

FIGS. 11A and 11B each show an overall structure of a semiconductor device 2000 according to the second example. In the second example, elements similar to those described in the first example will be designated by the same reference numerals as those in the first example, and a description thereof is omitted.

As shown in FIG. 11A, a hydrogen absorbing film 332 is formed on the entire surface of the semiconductor device 1000 shown in FIG. 1A except for the pad electrodes 800, so that the semiconductor device 2000 is formed.

In addition, as shown in FIG. 11B, an adhesion film 322 and the hydrogen absorbing film 332 are formed so as to closely adhere to the third protective film 300 of the semiconductor device 1000 shown in FIG. 1B. Furthermore, slits 370 are formed along peripheries of the pad electrodes 800 by removing the adhesion film 322 and the hydrogen absorbing film 332. The slits 370 are formed to electrically separate the pad electrodes 800 from each other. By the structure described above, intrusion of moisture and hydrogen through the third protective film 300 may be prevented. Accordingly, intrusion of moisture and hydrogen into the capacitor 510 having a ferroelectric film of the semiconductor device 2000 may be prevented. As a result, the reliability of the capacitor 510 having a ferroelectric film may be improved.

Hereinafter, a semiconductor device according to the third example will be described in detail with reference to the accompanying drawings.

FIGS. 12A and 12B each show an overall structure of a semiconductor device 3000 according to the third example. In the third example, elements similar to those described in the first and the second examples will be designated by the same reference numerals as those in the above examples, and a description thereof is omitted.

As shown in FIG. 12A, instead of the bonding wire 340 of the semiconductor device 1000 shown in FIG. 1A, a stud bump 341 is formed on the pad electrode 800.

In addition, as shown in FIG. 12B, instead of the bonding wire 340 of the semiconductor device 1000 shown in FIG. 1A, the stud bump 341 is formed on the pad electrode 800. By the structure as described above, since the stud bump 341 is formed to cover the pad electrode 800, intrusion of moisture and hydrogen through an opening portion 313 formed above the pad electrode 800 may be prevented. Hence, the reliability of the capacitor 510 having a ferroelectric film may be improved.

Hereinafter, a method of manufacturing a semiconductor device 4000 according to the fourth example and the semiconductor device 4000 will be described in detail with reference to the accompanying drawings. According to the method of manufacturing the semiconductor device 4000 and the semiconductor device 4000, since an adhesion film 324 on a pad electrode 801 is formed of the same material as that for a second conductive film 400, the adhesion to a hydrogen absorbing film 334 may be further improved. Hence, the reliability of the capacitor 510 having a ferroelectric film of the semiconductor device 4000 may be improved.

Figure 13A:
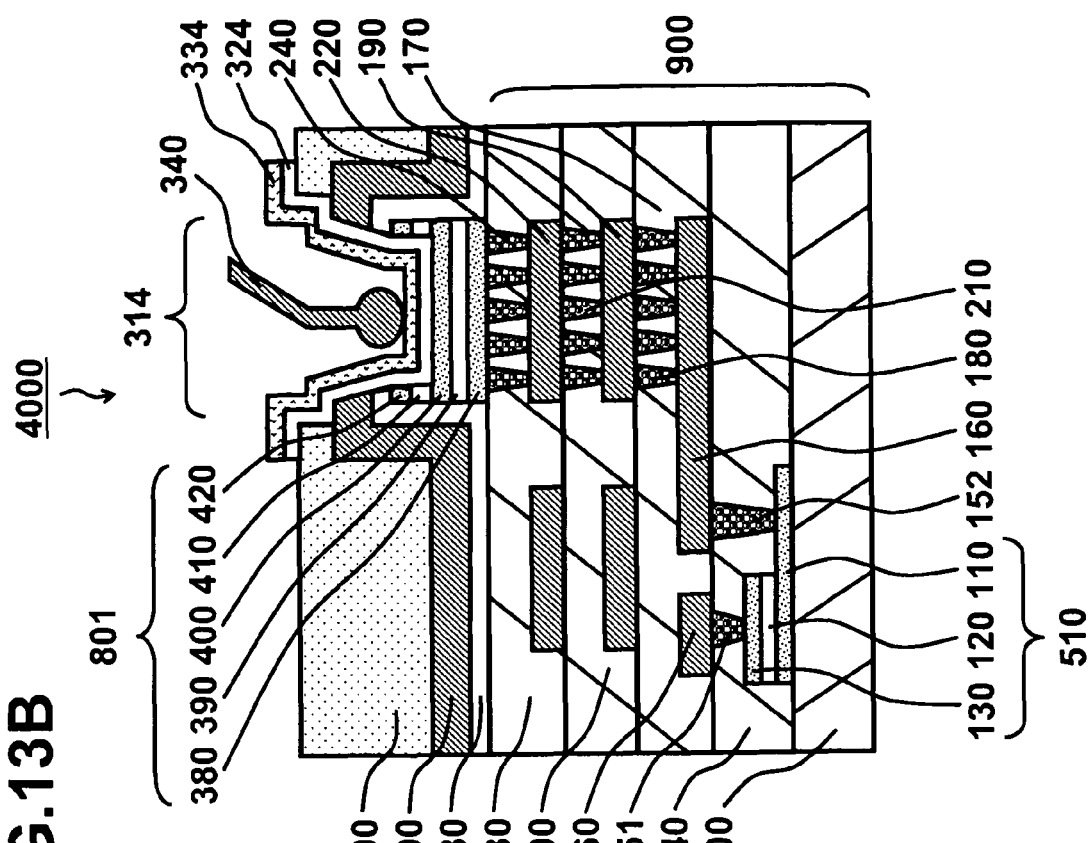
FIG. 13A is a plan view of a semiconductor device according to a fourth example.
Figure 13B:
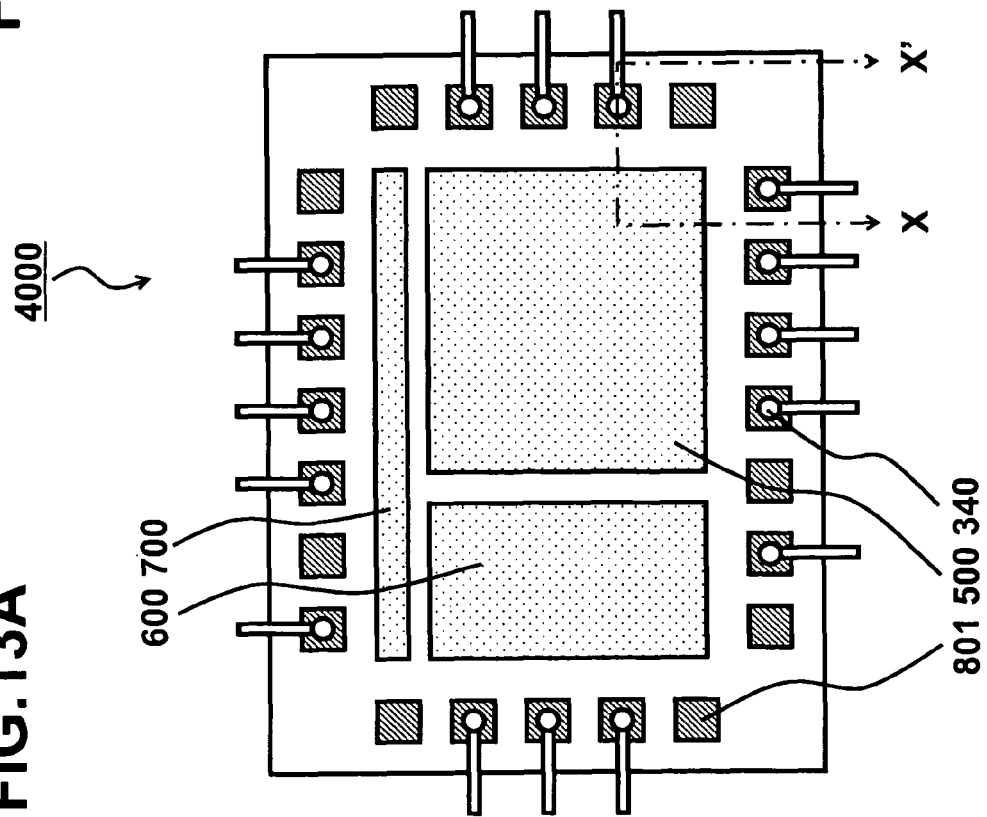
FIG. 13B is a cross-sectional view of the semiconductor device according to the fourth example.

FIGS. 13A and 13B each show an overall structure of the semiconductor device 4000 according to the fourth example. In the fourth example, elements similar to those of the first, the second, and the third examples are designated by the same reference numerals as those in the above examples, and a description thereof is omitted.

FIG. 13A is a plan view showing the shape of the semiconductor device 4000 according to the fourth example. The semiconductor device 4000 includes the ferroelectric memory (FRAM) circuit portion 500 formed on a semiconductor chip, the logic circuit portion 600, the peripheral circuit portion 700, and the pad electrodes 801. The pad electrodes 801 are disposed in a peripheral portion of the semiconductor device 4000. In this example, the peripheral portion is a region in the vicinity of the sides of the semiconductor chip and a region other than the ferroelectric memory circuit portion 500, the logic circuit portion 600, and the peripheral circuit portion 700.

FIG. 13B is a cross-sectional view of the semiconductor device 4000 according to the fourth example, taken along the line X-X' of FIG. 13A.

The pad electrode 801 is formed of a first conductive film 380, a first conductive pad 390, a second conductive film 400, a second conductive pad 410, and a third conductive film 420 sequentially laminated in this order over the wiring structure 900. The first conductive film 380 is formed on the fourth interlayer insulating film 230 so as to be connected to the fourth contact plugs 240. The first conductive pad 390 is formed on the first conductive film 380. The second conductive film 400 is formed on the first conductive pad 390. The second conductive pad 410 is formed on a peripheral portion of the second conductive film 400. The third conductive film 420 is formed on the second conductive pad 410. The pad electrode 801 has a recess.

The first protective film 280 is formed on the fourth interlayer insulating film 230 and the third conductive film 420 and on the side surface of the pad electrode 801. The second protective film 290 is formed on the first protective film 280. The third protective film 300 is formed on the second protective film 290. In addition, the third protective film 300 has an opening portion 314 which exposes the pad electrode 801. The opening portion 314 is formed in the third protective film 300, the second protective film 290, the first protective film 280, the third conductive film 420, and the second conductive pad 410, and exposes the second conductive film 400.

The adhesion film 324 is formed so as to cover the inside of the opening portion 314 of the third protective film 300. That is, the adhesion film 324 is formed so as to closely adhere to the exposed surface of the second conductive film 400 and to the side surfaces of the second conductive pad 410, the third conductive film 420, the first protective film 280, the second protective film 290, and the third protective film 300. The hydrogen absorbing film 334 is formed on the adhesion film 324.

The bonding wire 340 is formed on the hydrogen absorbing film 334 so as to be connected to the pad electrode 801. Accordingly, since the opening portion 314 is present, the first protective film 280, the second protective film 290, and the third protective film 300 are not present above the pad electrode 801. However, since the adhesion film 324 and the hydrogen absorbing film 334 are formed to closely adhere to the inside of the opening portion 314, intrusion of moisture through the pad electrode 801 is prevented.

With reference to FIGS. 14A to 22, the method of manufacturing the semiconductor device 4000, according to this example, will be described in accordance with the order of operations. Operations and structures similar to those described in the first example are designated by the same reference numerals as those in the first example, and a description is omitted.

FIG. 14A is a view showing the state in which the capacitor 510 having a ferroelectric film is formed on the lower interlayer insulating film 100 as the wiring structure 900. An operation of forming a cross-section shown in FIG. 14A is performed as in the operation shown in FIG. 2A.

FIG. 14B shows the state in which a conductive film for forming the pad electrode 801 is deposited over the wiring structure 900. First, a TiN film 381 is formed on the entire surface of the fourth interlayer insulating film 230 by a PVD method so as to have a thickness of, for example, 100 nm. Next, an Al alloy film 391 is formed on the TiN film 381 by a PVD method so as to have a thickness of, for example, 250 nm. The Al alloy film 391 is preferably an alloy including, for example, 95.5% of Al and 0.5% of Cu. Subsequently, a TiN film 401 is formed on the Al alloy film 391 by a PVD method so as to have a thickness of, for example, 100 nm. The reason for this is that since the Al alloy film 391 is liable to be oxidized, the TiN film 401 is formed on the Al alloy film 391 so as to suppress the oxidation thereof. Next, an Al alloy film 411 is formed on the TiN film 401 by a PVD method so as to have a thickness of, for example, 250 nm. A TiN film 421 is then formed on the Al alloy film 411 by a PVD method so as to have a thickness of, for example, 100 nm.

Figure 15B:
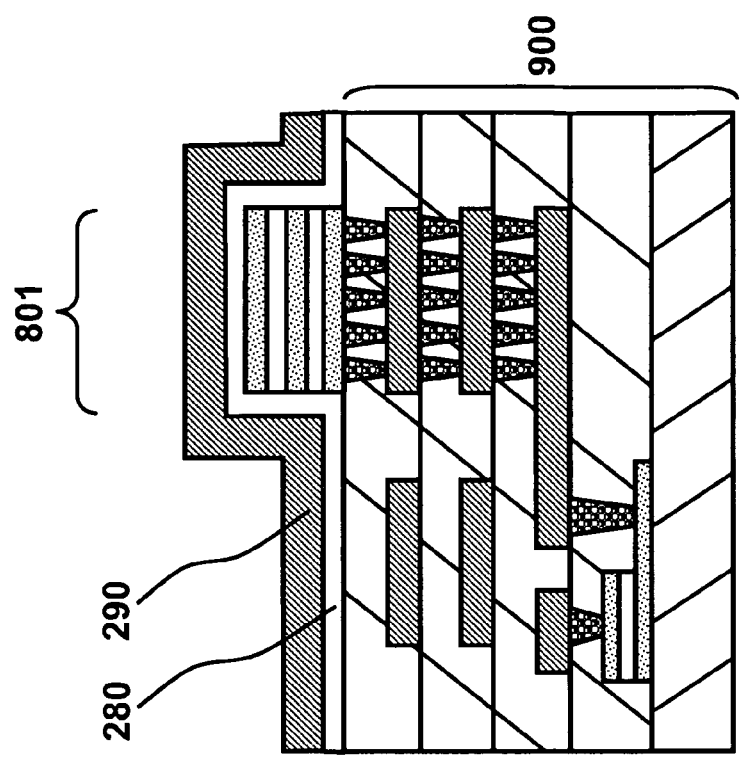
FIGS. 15A-15B are views each showing an operation of manufacturing the semiconductor device according to the fourth example.
Figure 15A:
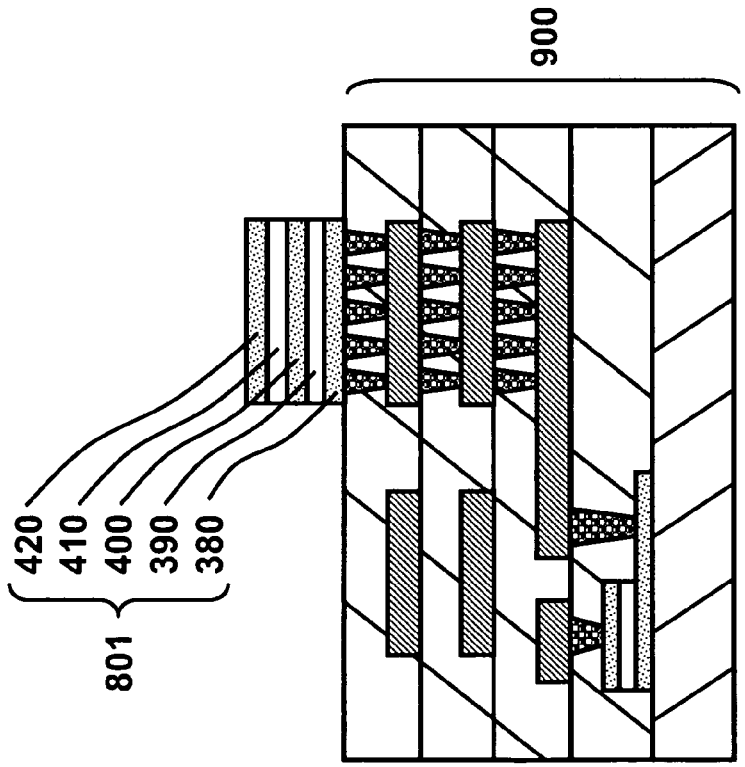

FIG. 15A is a view showing the state in which the pad electrode 801 is formed over the wiring structure 900. As shown in FIG. 15A, by a patterning and an etching technique, a resist having a pattern is formed on the TiN film 421 thus deposited, and the conductive films (the TiN film 381, the Al alloy film 391, the TiN film 401, the Al alloy film 411, and the TiN film 421) are etched using the resist as a mask, so that the pad electrode 801 composed of the first conductive film 380, the first conductive pad 390, the second conductive film 400, the second conductive pad 410, and the third conductive film 420 is formed. The pad electrode 801 preferably has a rectangular shape having a side in the range of 80 to 100 μm. As described above, the pad electrode 801 connected to the fourth contact plugs 240 is formed.

FIG. 15B shows the state in which the first protective film 280 and the second protective film 290 are deposited over the wiring structure 900. As shown in FIG. 15B, first, the first protective film 280 is formed on the pad electrode 801 and on the surface of the fourth interlayer insulating film 230, for example, by a CVD method so as to have a thickness of 100 nm to 300 nm. Next, in order to nitride the surface of the first protective film 280, $N_2O$ plasma annealing is performed, for example, in a CVD furnace. Subsequently, the second protective film 290 is formed on the first protective film 280 by a plasma CVD method so as to have a thickness of 400 nm to 1,000 nm. The second protective film 290 may be formed using, for example, p-SiN (silicon nitride).

Figure 16A:
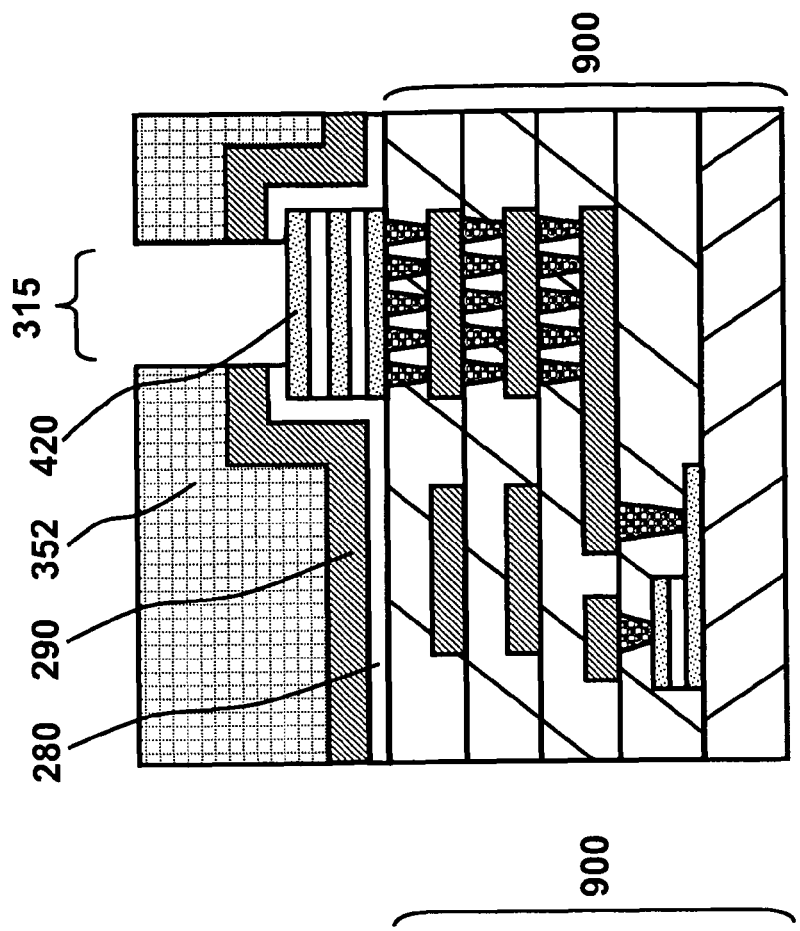

FIG. 16A is a view showing the state in which a resist 352 and an opening portion 315 penetrating the resist 352 are formed. As shown in FIG. 16A, the resist 352 patterned by a photolithographic technique is formed on the second protective film 290. As a result, the opening portion 315 penetrating the resist 352 is formed to have a width of 70 to 90 μm.

Figure 16B:
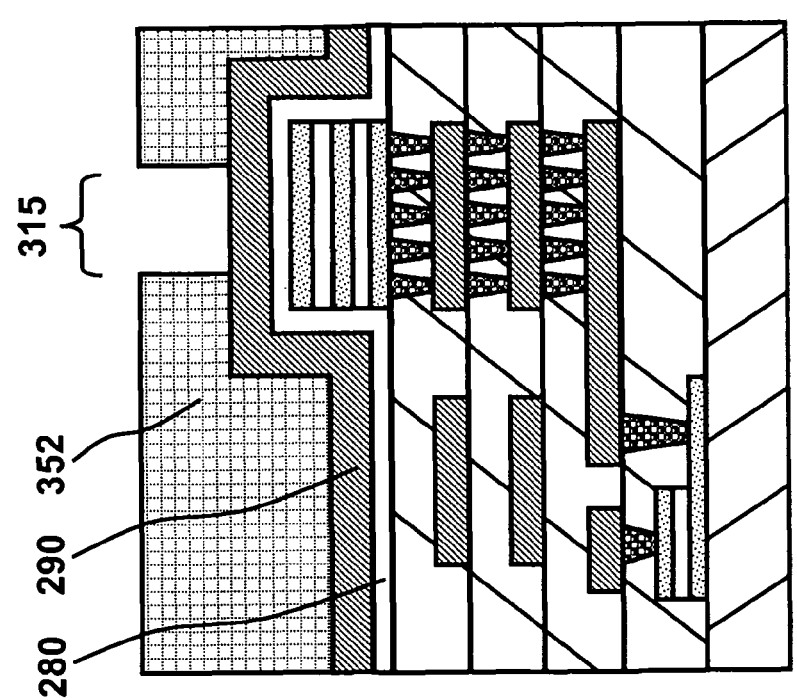

FIG. 16B is a view showing the state in which the surface of the pad electrode 801 is exposed. As shown in FIG. 16B, by anisotropic etching using the resist 352 as a mask, the opening portion 315 is formed into an opening portion penetrating the first protective film 280 and the second protective film 290.

FIG. 17A is a view showing the state in which the third conductive film 420 of the pad electrode 801 is partly etched. As shown in FIG. 17A, by isotropic etching using the resist 352 as a mask, the third conductive film 420 is partly etched so as to form an opening therein. By this operation, the surface of the second conductive pad 410 is exposed. The side surface of the third conductive film 420 withdraws from the first protective film 280 and the second protective film 290 by 70 nm to 90 nm and by up to approximately 150 nm. When the adhesion film 324 and the hydrogen absorbing film 334, which will be described later, are formed inside the opening portion 315, the withdrawal of the side surface of the third conductive film 420 as described above causes cracks and the like in the adhesion film 324 and the hydrogen absorbing film 334.

Subsequently, as shown in FIG. 17B, the resist 352 on the second protective film 290 is removed.

FIG. 18A is a view showing the state in which the third protective film 300 having the opening portion 315 is formed above the pad electrode 801. As shown in FIG. 18A, the third protective film 300 is formed by the operations of applying a photosensitive polyimide onto the second protective film 290, and then removing a polyimide layer on the pad electrode 801 by exposure and development. The thickness of the third protective film 300 is preferably in the range of, for example, 2,000 nm to 4,000 nm. Next, the photosensitive polyimide forming the third protective film 300 is cured in a manner similar to that shown in the operation of FIG. 6A of the first example.

FIG. 18B is a view showing the state in which inspection is performed, for example, to confirm functions of the semiconductor device 4000 formed on a wafer surface. Since the semiconductor device 4000 of this example incorporates nonvolatile memories, operation associated with data storage functions must be confirmed as in the operation shown in FIG. 6B of the first example. In the inspection as described above, the front end of the measurement terminal 360 of the tester is brought into contact with the second conductive pad 410. For example, when the number of inspections is large as in a memory incorporating logic LSI, the hard measurement terminal 360 must be brought into contact with the same pad many times. In this case, as a result, scratches and the like are generated on the second conductive pad 410. However, since the second conductive film 400 provided under the second conductive pad 410 is harder than the measurement terminal 360, the measurement terminal 360 is stopped by the hard second conductive film 400, and the first conductive film 380 and the first conductive pad 390, which are located under the second conductive film 400, are not influenced thereby.

Figure 19A:
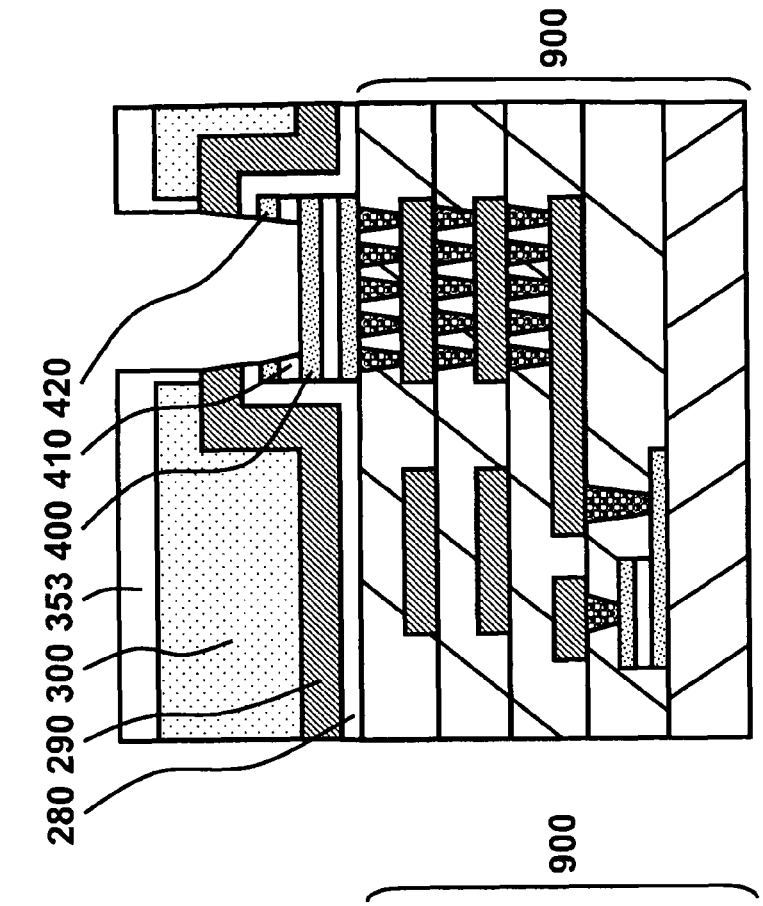
FIGS. 19A-19B are views each showing an operation of manufacturing the semiconductor device according to the fourth example.

FIG. 19A is a view showing the state in which a resist 353 having the opening portion 315 is formed above the pad electrode 801. As shown in FIG. 19A, the resist 353 patterned by a photolithographic technique is formed on the third protective film 300 and on the second protective film 290. This resist 353 has an opening portion 315 of 80 to 100 μm in width above the pad electrode 801. By the operation described above, the side surfaces of the first protective film 280, the second protective film 290, and the third protective film 300 and the second conductive pad 410 are exposed through the opening portion 315. The width of the opening portion 315 is approximately equivalent to that of the opening portion of the third conductive film 420.

Figure 19B:
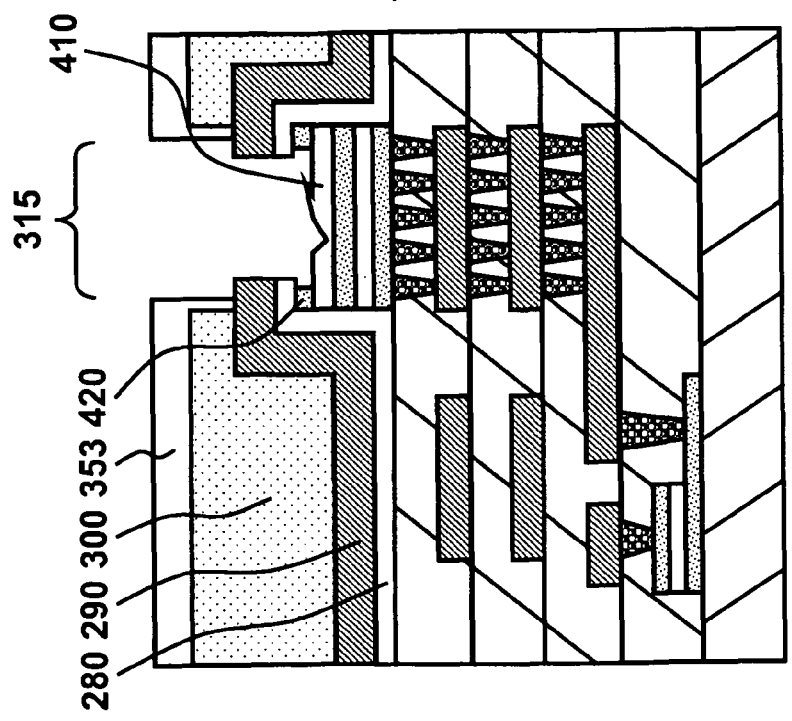

FIG. 19B is a view showing the state in which the surface of the pad electrode 801 is etched. As shown in FIG. 19B, in order to smooth corners of the second conductive pad 410, the third conductive film 420, the first protective film 280, and the second protective film 290, Argon (Ar) sputtering is performed, for example, in an inductively coupled plasma etching apparatus. As the Ar plasma etching conditions, for example, a source power is set to 2,000 W, a bias power is set to 300 W, a reaction pressure is set to 10 millitorr, an Ar flow rate is set to 90 to 99 sccm, an etching rate is set to 500 nm/minute, and a wafer temperature is set to 20 to 250° C. In addition, in order to increase the etching rates of the second conductive pad 410 and the third conductive film 420, 1 to 10 sccm of a chlorine gas is preferably added.

When the surface of the pad electrode 801 is etched under the conditions as described above, the damaged portion of the second conductive pad 410 is etched off and the surface of the second conductive film 400 is exposed. In addition, since the corners of the side surfaces of the first protective film 280 and the second protective film 290 are rounded, and a discontinuous surface disappears, the surface of the second conductive film 400 at the opening portion and side wall portions of the second conductive pad 410 and the third conductive film 420 of the pad electrode 801 form a smooth continuous surface. In addition, the side walls of the second conductive pad 410, the third conductive film 420, the first protective film 280, and the second protective film 290 are preferably formed to have an angle of 80 to 85° by adjusting the etching conditions.

Figure 20A:
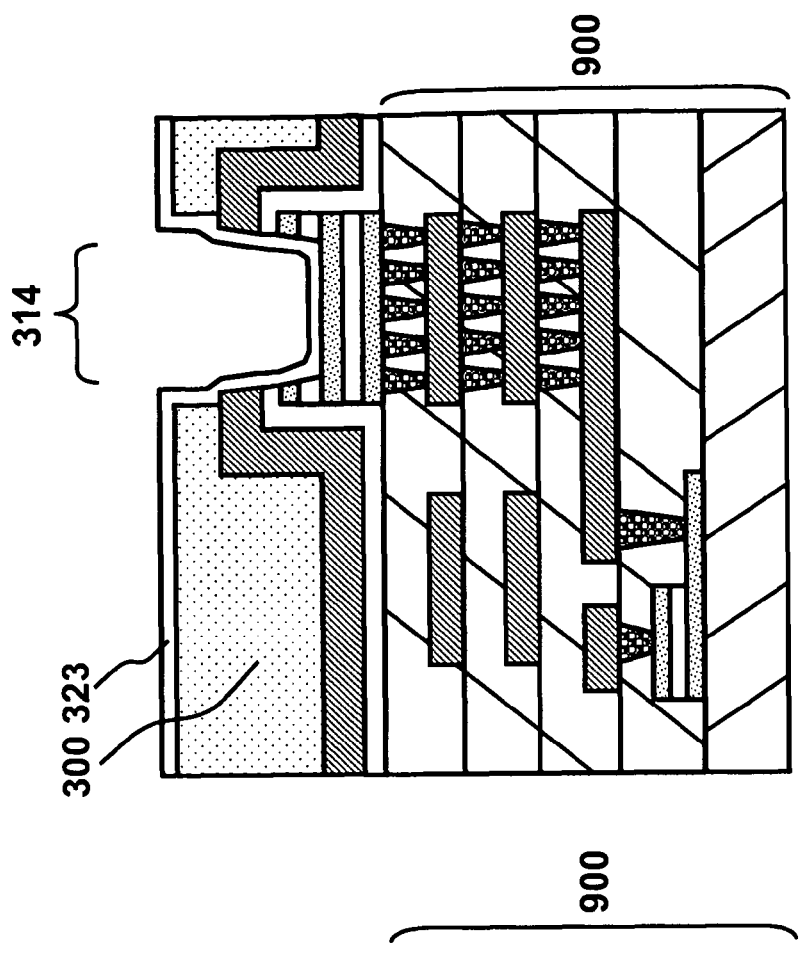
FIGS. 20A-20B are views each showing an operation of manufacturing the semiconductor device according to the fourth example.

Next, as shown in FIG. 20A, the resist 353 on the second protective film 290 and the third protective film 300 is removed.

Figure 20B:
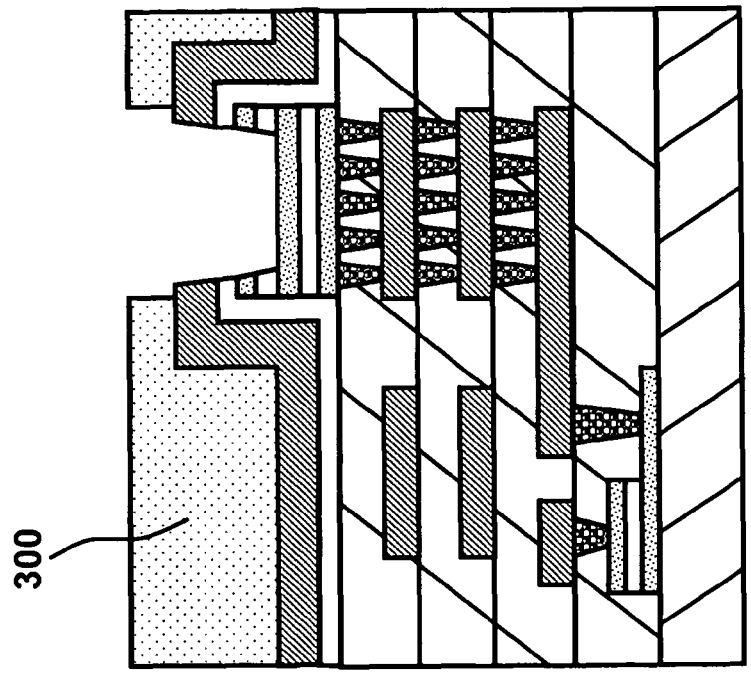

FIG. 20B is a view showing the state in which a TiN film 323 is deposited. As shown in FIG. 20B, the TiN film 332 is formed on the entire surface, for example, by a PVD method to have a thickness of 150 nm to 200 nm. Since the side wall of the pad electrode 801 is smooth, the TiN film 323 may be formed without being interrupted. The TiN film 323 is formed to improve the adhesion between the hydrogen absorbing film 334 which will be described later and the second conductive film 400, the second conductive pad 410, the first protective film 280, and the second protective film 290. Since the TiN film 323 is formed of the same TiN as that for the second conductive film 400, the adhesion with the hydrogen absorbing film 334 may be improved.

Figure 21A:
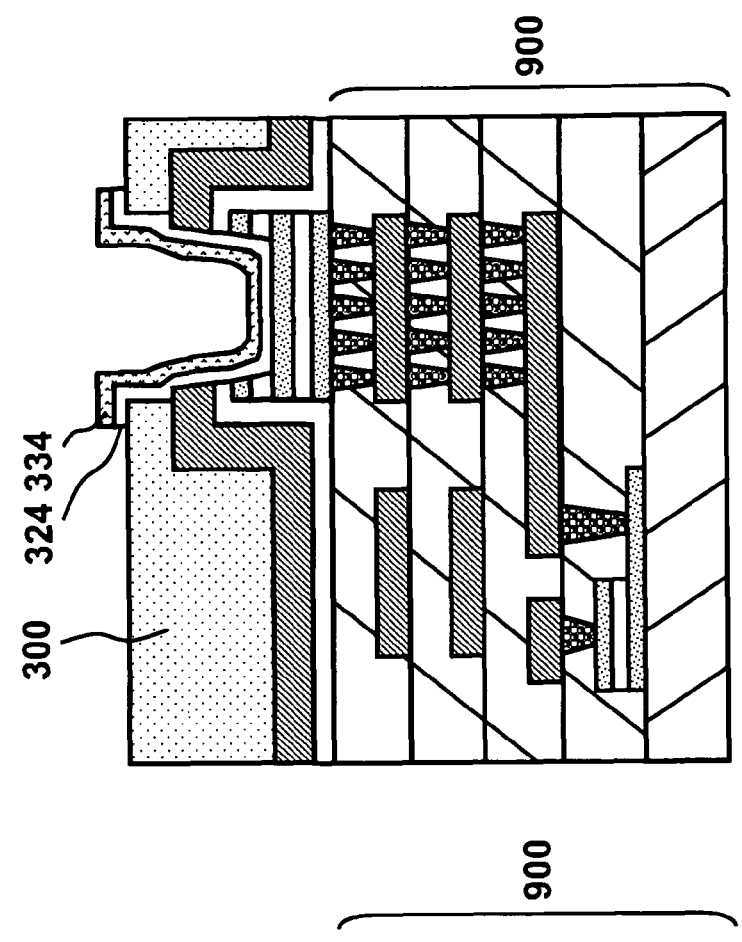
FIGS. 21A-21B are views each showing an operation of manufacturing the semiconductor device according to the fourth example.

FIG. 21A is a view showing the state in which a Pd film 333 is deposited. As shown in FIG. 21A, the Pd film 333 is formed on the TiN film 323, for example, by a PVD method so as to have a thickness of 150 nm to 200 nm. The Pd film 333 is formed to improve humidity resistance of the capacitor 510 having a ferroelectric film by absorbing hydrogen.

Figure 21B:
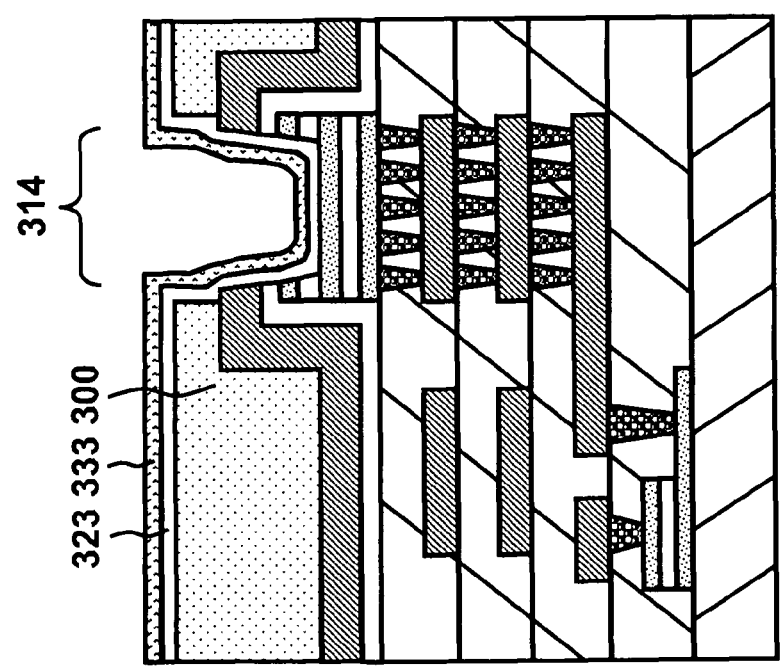

FIG. 21B is a view showing the state in which the adhesion film 324 and the hydrogen absorbing film 334 are formed. As shown in FIG. 21B, the TiN film 323 and the Pd film 333 are patterned and etched, so that parts of the TiN film 323 and the Pd film 333 other than those provided inside the opening portion 314 are removed. The TiN film 323 may be etched when it is immersed in a mixed solution of ethylenediamine tetraacetic acid (EDTA), ammonia, hydrogen peroxide solution, and pure water for 9 minutes. The etching rate of the TiN film 323 was approximately 38 nm/minute. The Pd film 333 may be etched when it is immersed in a mixed solution of ammonium iodide, iodine, ethyl alcohol, and pure water for 9 minutes. The etching rate of the Pd film 333 was approximately 92.5 nm/minute. By the operations described above, the adhesion film 324 of TiN and the hydrogen absorbing film 334 of Pd are formed inside the opening portion 314.

Figure 22:
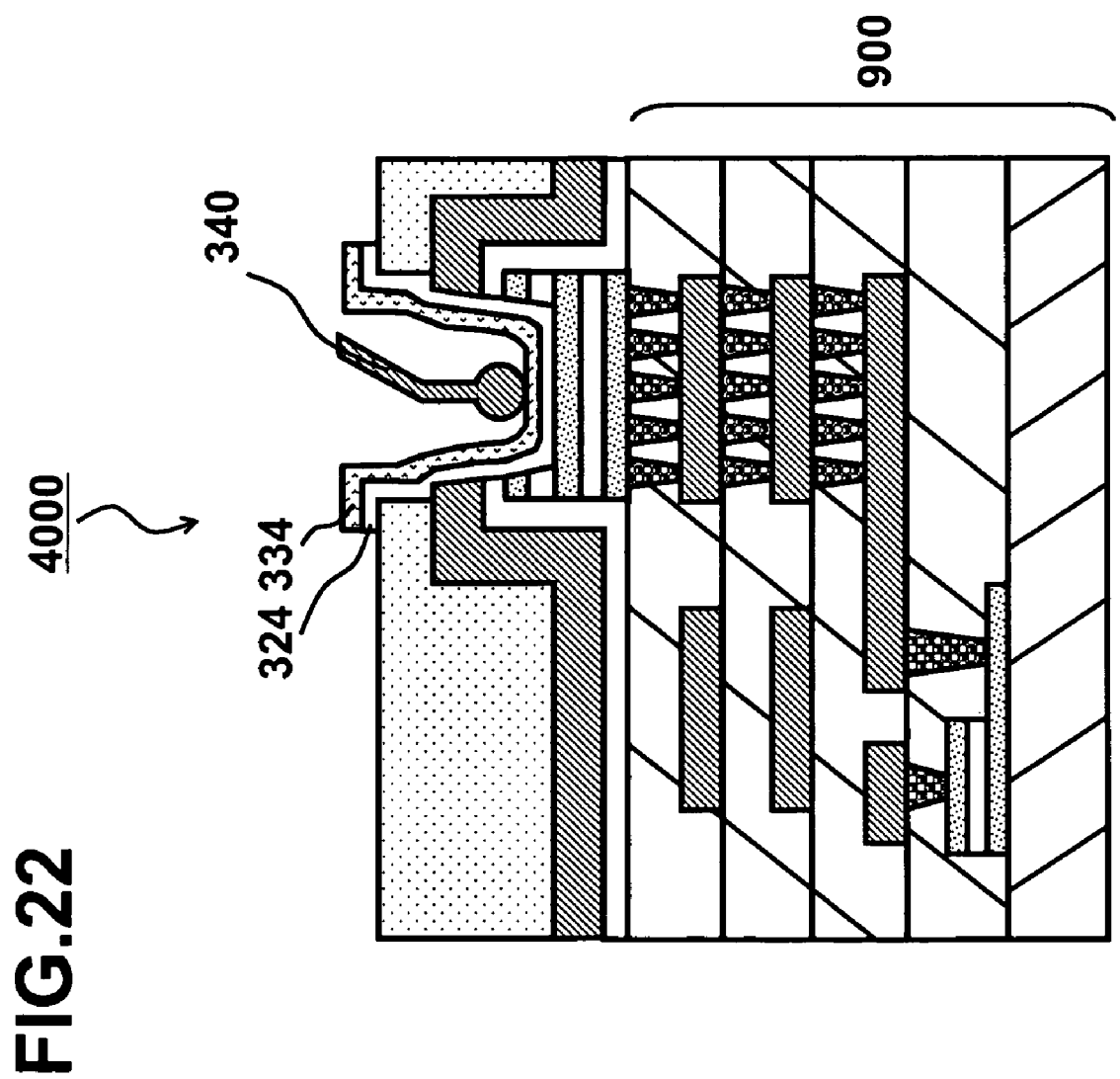
FIG. 22 is a view showing an operation of manufacturing the semiconductor device according to the fourth example.

FIG. 22 is a view showing an operation in which the bonding wire 340 is formed. As shown in FIG. 22, one end of the bonding wire 340 is bonded to the hydrogen absorbing film 334 provided above the pad electrode 801. The other end of the bonding wire 340 is boned to a lead, a pad, or a land (not shown in the figure).

According to the method of manufacturing a semiconductor device of the fourth example, since the adhesion film 324 provided on the pad electrode 801 is formed of the same material as that for the second conductive film 400, the adhesion with the hydrogen absorbing film 334 may be improved. Accordingly, intrusion of moisture and hydrogen through the pad electrode 801 into the capacitor having a ferroelectric film of the semiconductor device 4000 may be prevented. Hence, the reliability of the capacitor 510 having a ferroelectric film of the semiconductor device 4000 may be improved.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modification and equivalents may be resorted to, falling within the scope thereof.

What is claimed is:

1. A method of manufacturing a semiconductor device comprising:

forming a capacitor having electrodes and a ferroelectric film provided therebetween above a substrate;

forming a pad electrode electrically connected to one of the electrodes of the capacitor above the substrate;

forming a protective film covering the pad electrode over the substrate;

forming an opening in the protective film exposing at least a part of the pad electrode;

bringing a measurement terminal into contact with the exposed surface of the pad electrode;

etching the surface of the pad electrode after the measurement terminal is brought into contact therewith; and forming a hydrogen absorbing film on the protective film and the pad electrode exposed through the opening.

2. The method according to claim 1, wherein the pad electrode is formed by sequentially laminating a first conductive film including a TiN film, a conductive pad being formed so as to have a recess at the opening and a flat region, and a second conductive film including a TiN film and provided on the flat region.

3. The method according to claim 1, wherein the pad electrode is formed by sequentially laminating a first conductive film including a TiN film, a first conductive pad, a second conductive film including a TiN film, a second conductive pad, a third conductive film including a TiN film, and the pad electrode being formed so as to have a recess at the opening through which the second conductive pad and the second conductive film are exposed.

4. The method according to claim 1, wherein the forming hydrogen absorbing films further includes forming Ti film or TiN film, and forming Pd film on the Ti film or the TiN film.

5. The method according to claim 1, wherein the ferroelectric film includes lead titanate zirconate.

6. The method according to claim 1, further comprising forming a connecting bonding wire or a stud bump over the hydrogen absorbing film.

* * * * *